US008258022B2

(12) United States Patent
Jung et al.

(10) Patent No.: US 8,258,022 B2
(45) Date of Patent: Sep. 4, 2012

(54) ARRAY SUBSTRATE FOR LIQUID CRYSTAL DISPLAY DEVICE AND METHOD OF FABRICATING THE SAME

(75) Inventors: Ji-Hyun Jung, Ulsan (KR); Dong-Young Kim, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/105,341

(22) Filed: May 11, 2011

(65) Prior Publication Data
US 2011/0212581 A1 Sep. 1, 2011

Related U.S. Application Data

(62) Division of application No. 11/823,486, filed on Jun. 26, 2007, now Pat. No. 7,960,735.

(30) Foreign Application Priority Data

Jun. 30, 2006 (KR) .............................. 2006-0060866

(51) Int. Cl.
*H01L 21/28* (2006.01)

(52) U.S. Cl. .......................... 438/149; 438/479; 438/517

(58) Field of Classification Search .......... 438/148–149, 438/479–480, 517, E29.273
See application file for complete search history.

(56) References Cited

U.S. PATENT DOCUMENTS

| 6,620,655 | B2* | 9/2003 | Ha et al. ........................ 438/149 |
| 7,553,708 | B2* | 6/2009 | Ahn et al. ...................... 438/149 |
| 8,173,492 | B2* | 5/2012 | Lee et al. ....................... 438/149 |
| 8,173,498 | B2* | 5/2012 | Lin et al. ........................ 438/155 |
| 8,178,881 | B2* | 5/2012 | Oh et al. ........................ 438/158 |
| 2002/0180898 | A1 | 12/2002 | Yoo et al. |
| 2005/0088598 | A1 | 4/2005 | Matsumori et al. |
| 2006/0114399 | A1 | 6/2006 | Kim |

FOREIGN PATENT DOCUMENTS

| JP | 03-196020 | 8/1991 |
| JP | 2000-164584 | 6/2000 |
| JP | 2001-242490 | 9/2001 |
| JP | 2001-326360 | 11/2001 |
| JP | 2002-303877 | 10/2002 |
| JP | 2004-193248 | 7/2004 |

OTHER PUBLICATIONS

Office Action issued in corresponding Japanese Patent Application No. 2007-172231; mailed Jul. 26, 2010.
Office Action issued in corresponding Chinese Patent Application No. 2007101114230; issued Nov. 28, 2008.
Office Action issued in corresponding Japanese Patent Application 2007-172231; mailed Feb. 2, 2011.
Office Action issued in corresponding Japanese Patent Application No. 2007-172231, mailed Jul. 13, 2011.

* cited by examiner

*Primary Examiner* — Cuong Q Nguyen
(74) *Attorney, Agent, or Firm* — Brinks Hofer Gilson & Lione

(57) ABSTRACT

An array substrate for a liquid crystal display device comprises a substrate having a pixel region, a gate line on the substrate, and a data line crossing the gate line to define the pixel region. A thin film transistor (TFT) includes a gate electrode connected to the gate line, an insulating layer on the gate electrode, an active layer on the insulating layer, an ohmic contact layer on the active layer, a source electrode connected to the data line and a drain electrode spaced apart from the source electrode. A pixel electrode connects to the drain electrode and is disposed in the pixel region. An opaque metal pattern is provided on end portions of the pixel electrode.

11 Claims, 45 Drawing Sheets

ARRAY SUBSTRATE FOR LIQUID CRYSTAL DISPLAY DEVICE AND METHOD OF FABRICATING THE SAME The present patent document is a divisional of U.S. patent application Ser. No. 11/823,486, filed Jun. 26, 2007, now U.S. Pat. No. 7,960,735 which claims priority to Korean Patent Application No. 2006-0060866 filed in Korea on Jun. 30, 2006, which is hereby incorporated by reference.

BACKGROUND

1. Field of the Invention

The present disclosure relates to a liquid crystal display (LCD) device and more particularly to an array substrate having no wavy noise problem and an improved aperture ratio and a method of fabricating the array substrate.

2. Discussion of the Related Art

The conventional LCD devices use an optical anisotropic property and polarization properties of liquid crystal molecules to display images. The liquid crystal molecules have orientation characteristics of arrangement resulting from their thin and long shape. Thus, an arrangement direction of the liquid crystal molecules can be controlled by applying an electrical field to them. Accordingly, when the electric field is applied to them, the polarization properties of light are changed according to the arrangement of the liquid crystal molecules such that the LCD devices display images.

The LCD device includes a first substrate, a second substrate and a liquid crystal layer interposed therebetween. A common electrode and a pixel electrode are respectively formed on the first and second substrates. The first and second substrates may be referred to as a color substrate and an array substrate, respectively. The liquid crystal layer is driven by a vertical electric field induced between the common and pixel electrodes. The LCD device usually has excellent transmittance and aperture ratio.

Among the known types of LCD devices, active matrix LCD (AM-LCD) devices, which have thin film transistors (TFTs) arranged in a matrix form, are the subject of significant research and development because of their high resolution and superior ability in displaying moving images.

FIG. 1 is a schematic perspective view of an LCD device according to the related art. As shown in FIG. 1, the LCD device 51 includes a first substrate 5, a second substrate 10 and a liquid crystal layer (not shown) interposed therebetween. The first and second substrates 5 and 10 face and are spaced apart from each other. A black matrix 6, a color filter layer, which includes sub-color filters 7a, 7b and 7c, and a common electrode 9 are formed on the first substrate 5. The black matrix 6 has a lattice pattern and blocks light through the second substrate 10. Each of the sub-color filters 7a, 7b and 7c has one of red R, green G and blue B colors. The sub-color filters 7a, 7b and 7c are formed in the lattice patterns. The common electrode 9 of a transparent conductive material is formed on the black matrix 6 and the color filter layer 7.

A gate line 14 and a data line 26 are formed on the second substrate 10. The gate and data lines 14 and 26 cross each other such that a pixel region P is defined on the second substrate 10. A thin film transistor (TFT) T is formed in the pixel region P. The TFT T is connected to the gate and data lines 14 and 26. Although not shown, the TFT T includes a gate electrode, a semiconductor layer, a source electrode, and a drain electrode. The gate and source electrodes are connected to the gate line 14 and the data line 26, respectively. The source electrode is spaced apart from the drain electrode.

Moreover, a pixel electrode 32 is formed in the pixel region P. The pixel electrode 32 is connected to the TFT T. The pixel electrode 32 is formed of a transparent conductive material, such as indium-tin-oxide (ITO) and indium-zinc-oxide (IZO). As mentioned above, an electric field is induced between the common and pixel electrodes 9 and 32 to drive the liquid crystal layer (not shown).

Generally, the array substrate may be fabricated by one of a five mask process and a six mask process. The five mask process includes the following steps.

In a first mask process, the gate electrode and the gate line are formed on the second substrate. At the same time, a gate pad, which is formed at one end of the gate line, is formed on the second substrate. Then, a gate insulating layer is formed on the entire surface of the second substrate having the gate electrode and the gate line.

In a second mask process, the semiconductor layer, which includes an active layer and an ohmic contact layer, is formed on the gate insulating layer. The semiconductor layer corresponds to the gate electrode.

In a third mask process, the data line, the source electrode and the drain electrode are formed on the gate insulating layer and the semiconductor layer. The source and drain electrodes correspond to the semiconductor layer. At the same time, a data pad, which is disposed at one end of the data line, is formed on the gate insulating layer.

In a fourth mask process, a passivation layer having a drain contact hole is formed on the data line, the source electrode and the drain electrode. The drain contact hole exposes the drain electrode.

In a fifth mask process, the pixel electrode is formed on the passivation layer. The pixel electrode is connected to the drain electrode through the drain contact hole.

Since the array substrate is fabricated through a complicated mask process, a possibility of deterioration increases and production yield decreases. In addition, since fabrication time and cost increase, a competitiveness of product is weakened.

To resolve these problems in the five mask process, a four mask process is suggested.

FIG. 2 is a plane view of one pixel region of the array substrate fabricated by a four mask process according to the related art. As shown in FIG. 2, the gate line 62 and the data line 98 are formed on the substrate 60. The gate and data lines 62 and 98 cross each other such that the pixel region P is defined on the substrate 60. The gate pad 66 is formed at one end of the gate line 62. The data pad 99 is formed at one end of the data line 98. A transparent gate pad terminal (GPT) is formed on the gate pad 66. The gate pad terminal GPT contacts the gate pad 66. A data pad terminal (DPT) of being transparent is formed on the data pad 99. The data pad terminal DPT contacts the data pad 99.

A TFT T including a gate electrode 64, a first semiconductor layer 91, a source electrode 94 and a drain electrode 96 is disposed at a crossing portion of the gate and data lines 62 and 98. The gate electrode 64 is connected to the gate line 62 and the source electrode 94 is connected to the data line 98. The source and drain electrodes 94 and 96 are spaced apart from each other on the first semiconductor layer 91. A pixel electrode PXL is formed in the pixel region P and contacts the drain electrode 96.

A metal layer 97 having an island shape and contacting the pixel electrode PXL overlaps a portion of the gate line 62. The portion of the gate line 62 as a first storage electrode, the metal layer 97 as a second storage electrode and a gate insulating layer (not shown) between the first and second storage electrodes as a dielectric material constitute a storage capacitor Cst.

A second semiconductor layer 92 is formed under the data line 98, and a third semiconductor layer 93 is formed under the metal layer 97. Because the second semiconductor layer 92 extends from the first semiconductor layer 91 in the four mask process, the second semiconductor layer 92 has the same structure as the first semiconductor layer 91. A portion of an active layer of the first semiconductor layer 91 is not covered by the gate electrode 64 and is exposed to light from a backlight unit (not shown) under the substrate 60. And, a portion of an active layer of the second semiconductor layer 92 is not covered by the data line 98 and is exposed to ambient light. Namely, the active layer of the second semiconductor layer 92 protrudes beyond the data line 98. Because the active layer of the first semiconductor layer 91 is formed of amorphous silicon, a photo leakage current is generated due to the light from the backlight unit. As a result, properties of the TFT T are degraded due to the photo leakage current. Moreover, because the active layer of the second semiconductor layer 92 is also formed of amorphous silicon, a leakage current is also generated in the second semiconductor layer 92 due to the ambient light. The light leakage current causes a coupling of signals in the data line 98 and the pixel electrode PXL to generate deterioration, such as a wavy noise, when displaying images. A black matrix (not shown) designed to cover the protruding portion of the second semiconductor layer 92 reduces aperture ratio of the LCD device.

FIGS. 3A and 3B are cross-sectional views taken along the line IIIa-IIIa and IIIb-IIIb of FIG. 2, respectively. As shown in FIGS. 3A and 3B, the first semiconductor layer 91 is formed under the source and drain electrodes 94 and 96 and the second semiconductor layer 92 is formed under the data line 98 in an array substrate fabricated through a four mask process according to the related art. The second semiconductor layer 92 extends from the first semiconductor layer 91.

The first semiconductor layer 91 includes an intrinsic amorphous silicon layer as an active layer 91a and an impurity-doped amorphous silicon layer as an ohmic contact layer 91b. The second semiconductor layer 92 includes an intrinsic amorphous silicon layer 92a and an impurity-doped amorphous silicon layer 92b.

Since the first semiconductor layer 91 is connected to the second semiconductor layer 92, a portion of the active layer 91a can not be completely covered by the gate electrode 64. The portion of the active layer 91a is exposed to light from the backlight unit (not shown), and thus a photo current is generated in the active layer 91a. This photo current becomes a leakage current in the TFT T, which causes an abnormal leakage of voltage in the pixel region P. As a result, properties of the TFT T are degraded.

Further, the intrinsic amorphous silicon layer 92a of the second semiconductor layer 92 under the data line 98 protrudes beyond the data line 98. When the protruding portion of the intrinsic amorphous silicon layer 92a is exposed to light from the backlight unit or an ambient light, it is repeatedly activated and inactivated, and thus a light leakage current is generated. Since the light leakage current is coupled with the signal in the pixel electrode PXL, arrangement of liquid crystal molecules is abnormally distorted. Accordingly, a wavy noise such as undesired waves shaped with thin lines are displayed in the LCD device occurs.

In one embodiment, a width of the data line is about 3.9 μm and the protruding portion of the active layer 92a of the second semiconductor layer 92 is about 1.85 μm. Generally, a distance between the data line 98 and the pixel electrode PXL is about 4.5 μm in consideration of alignment error in an LCD device through a five or a six mask process. Accordingly, a distance D between the data line 98 and the pixel electrode PXL is about 6.35 μm due to the protrusion of the amorphous silicon layer 92a.

Assume that a width of the black matrix BM and a width of the data line 98 are indicated as W1 and W2, respectively, and a width of a protruding portion of the active layer 92a of the second semiconductor layer 92 is indicated as D1. A distance between the data line and the pixel electrode PXL is indicated as D2, and a width considering the alignment error is indicated as D3. When the array substrate fabricated by the four mask process has the same distance D2 as width D3 considering the alignment error as the array substrate fabricated by the five mask process, the array substrate fabricated by the four mask process has a black matrix BM with a greater width W1. The increase in width W1 corresponds to the excess width of the protruding portion of the active layer 92a beyond the black matrix BM in the LCD device fabricated by the five mask. This difference in width W1 is because the array substrate fabricated by the five mask process does not have the protruding portion of an active layer under a data line. The increase in the width of the black matrix BM reduces aperture ratio.

FIGS. 4A to 4G are cross-sectional views showing a fabrication process of a portion taken along the line IIIa-IIIa of FIG. 2, FIGS. 5A to 5G are cross-sectional views showing a fabrication process of a portion taken along the line V-V of FIG. 2, and FIGS. 6A to 6G are cross-sectional views showing a fabrication process a portion taken along the line VI-VI of FIG. 2.

FIGS. 4A, 5A and 6A show a first mask process. As shown in FIGS. 4A, 5A and 6A, a gate line 62, a gate pad 66 and a gate electrode 64 are formed on a substrate 60 having a pixel region P, a switching region S, a gate pad region GP, a data pad region DP and a storage region C through a first mask process. The gate pad 66 is formed at one end of the gate line 62. The gate electrode 64 is connected to the gate line 62 and disposed in the switching region S. The gate pad 66 is disposed in the gate pad region GP. The gate line 62, the gate pad 66 and the gate electrode 64 are formed by depositing and patterning a first metal layer (not shown) using a first mask (not shown) as a patterning mask. The first metal layer includes one or more selected from a conductive metallic material group including aluminum (Al), aluminum alloy (AlNd), tungsten (W), chromium (Cr), molybdenum (Mo). The first metal layer may have a double-layered structure.

FIGS. 4B to 4E, 5B to 5E and 6B to 6E show a second mask process. As shown in FIGS. 4B, 5B and 6B, a gate insulating layer 68, an intrinsic amorphous silicon layer 70, an impurity-doped amorphous silicon layer 72 and a second metal layer 74 are formed on the substrate 60 having the gate line 62. The gate insulating layer 68 is formed of an inorganic insulating material or an organic insulating material. The inorganic insulating material may include one of silicon nitride and silicon oxide, and the organic insulating material may include one of benzocyclobuene (BCB) and acrylate resin. The second metal layer includes one or more selected from a conductive metallic material group including aluminum (Al), aluminum alloy (AlNd), tungsten (W), chromium (Cr), molybdenum (Mo). The second metal material may have a double-layered structure. A photoresist (PR) layer 76 is formed on the second metal layer 74. A second mask M is disposed over the photoresist layer 76. The second mask M has a transmitting portion B1, a blocking portion B2 and a half-transmitting portion B3. The transmitting portion B1 has a relatively high transmittance so that light through the transmitting portion B1 can completely change the PR layer 76 chemically. The blocking portion B2 shields light completely. The half-transmitting portion B3 has a slit structure or a half-transmitting film so that intensity or transmittance of light through the half-transmitting portion B3 can be lowered. As a result, a transmittance of the half-transmitting portion B3 is smaller than that of the transmitting portion B1 and is greater than that of the blocking portion B2.

The half-transmitting portion B3 and the blocking portions B2 at both sides of the half-transmitting portion B3 correspond to the switching region S. The transmitting portion B1 corresponds to the gate pad region GP and the pixel region P, and the blocking portion B2 corresponds to the storage region C and the data pad region DP. The PR layer 76 is exposed to light through the second mask M.

Next, as shown in FIGS. 4C, 5C and 6C, first to third PR patterns 78a, 78b and 78c are formed in the switching region S, the data pad region DP and the storage region C, respectively such that the second metal layer 74 is exposed by the first to third PR patterns 78a, 78b and 78c. The first PR pattern 78a has relatively low height in a center portion due to the half-transmitting portion B3 of the second mask M. Then, the second metal layer 74, the impurity-doped amorphous silicon layer 72 and the intrinsic amorphous silicon layer 70 are etched using the first to third PR patterns 78a to 78c as a mask.

The second metal layer 74, the impurity-doped amorphous silicon layer 72 and the intrinsic amorphous silicon layer 70 are continuously or separately etched depending on the metallic material of the second metal layer 74.

As shown in FIGS. 4D, 5D and 6D, first to third metal patterns 80, 82 and 86 are formed under the first to third PR patterns 7a, 7b and 7c, and first to third semiconductor patterns 90a, 90b and 90c are formed under the first to third metal patterns 80, 82 and 86. The second metal pattern 82 extends from the first metal pattern 80, and the third metal pattern 86 having an island shape is formed in the storage region C. The first to third semiconductor patterns 90a, 90b and 90c include an intrinsic amorphous silicon pattern 70a and an impurity-doped amorphous silicon pattern 72a.

Next, the first to third PR patterns 78a, 78b and 78c are ashed such that the thinner portion of the first PR pattern 78a is removed to expose the first metal pattern 80. At the same time, boundary portions of the first to third PR patterns 78a, 78b and 78c are also removed. As a result, the first to third PR patterns 78a to 78c are partially removed to form fourth to sixth PR patterns 79a, 79b and 79c exposing the first to third metal patterns 80, 82 and 86, respectively.

As shown in FIGS. 4E, 5E and 6E, the first to third metal patterns 80, 82 and 86 and the impurity-doped amorphous silicon layer 72a of the first to third semiconductor layers 90a, 90b and 90c are etched using the fourth to sixth PR patterns 79a to 79c. The first metal pattern 80 (of FIG. 4D) in the switching region S is etched to form source and drain electrodes 94 and 96, the second metal pattern 82 (of FIG. 6D) in the data pad region DP is etched to form a data line 98 and a data pad 99, and the third metal pattern 86 (of FIG. 4D) in the storage region C is etched to form a metal layer 97. The intrinsic amorphous silicon layer 70a (of FIG. 4D) and the impurity-doped amorphous silicon layer 72a (of FIG. 4D) of the first semiconductor pattern 90a (of FIG. 4D) are etched to form an active layer 91a and an ohmic contact layer 91b, respectively.

The active layer 91a and the ohmic contact layer 91b constitute a first semiconductor layer 91. The active layer 91a is exposed through the ohmic contact layer 91b and is over-etched so that impurities do not remain on the active layer 92a. In addition, the second and third semiconductor patterns 90b and 90c (of FIGS. 6D and 4D) are etched to form second and third semiconductor layers 92 and 93, respectively. An overlapped portion of the gate line 62 as a first storage electrode and the metal layer 97 as a second storage electrode constitutes a storage capacitor Cst with the gate insulating layer 68, which is interposed between the gate line 62 and the first metal layer 97, and the third semiconductor layer 93. The fourth to sixth PR patterns 79a, 79b and 79c are then removed.

FIGS. 4F, 5F, and 6F show a third mask process. As shown in FIGS. 4F, 5F, and 6F, a passivation layer PAS is formed on the substrate 60 having the data line 98. The passivation layer PAS is patterned using a third mask (not shown) to form a drain contact hole CH1 exposing the drain electrode 96, a storage contact hole CH2 exposing the metal layer 97, and a data pad contact hole CH4 exposing the data pad 99. Also, the passivation layer PAS and the gate insulating layer 68 are patterned using the third mask (not shown) to form a gate pad contact hole CH3 exposing the gate pad 66.

FIGS. 4G, 5G and 6G show a fourth mask process. As shown in FIGS. 4G, 5G and 6G, a transparent conductive material is deposited on the passivation layer PAS and patterned through a fourth mask (not shown) to form a pixel electrode PXL, a gate pad terminal GPT and a data pad terminal DPT. The pixel electrode PXL contacts the drain electrode 96 through the drain contact hole CH1 and the metal layer 97 through the storage contact hole CH2. The gate pad terminal GPT contacts the gate pad 66 through the gate pad contact hole CH3, and the data pad terminal DPT contacts the data pad 99 through the data pad contact hole CH4.

Through the above four mask process, the array substrate is fabricated. Compared to the five mask process, production costs and production time can be saved by the four mask process.

However, as mentioned above, the intrinsic amorphous silicon layer of the second semiconductor layer protrudes beyond the data line. Accordingly, a wavy noise occurs and aperture ratio is reduced.

Further, because the active layer is connected to the intrinsic amorphous silicon layer of the second semiconductor layer, a portion of the active layer is not covered by the gate electrode. Accordingly, the light leakage current is generated in the thin film transistor. Also, because the active layer should be formed thickly in consideration of the over-etching, fabrication time and product cost increase.

Moreover, because the LCD device having the array substrate fabricated by the fourth mask process requires a black matrix having a width greater than that of the LCD device having the array substrate fabricated by the five mask process, aperture ratio is further reduce.

BRIEF SUMMARY

Accordingly, the present disclosure is directed to an array substrate for a liquid crystal display (LCD) device and a method of fabricating the same that substantially obviates one or more of the problems due to limitations and disadvantages of the related art.

To achieve these and other advantages and in accordance with one aspect of the disclosure, an array substrate for a liquid crystal display (LCD) device includes a substrate having a pixel region, a gate line on the substrate, and a data line crossing the gate line to define the pixel region. A thin film transistor (TFT) includes a gate electrode connected to the gate line, an insulating layer on the gate electrode, an active layer on the insulating layer, an ohmic contact layer on the active layer, a source electrode connected to the data line and a drain electrode spaced apart from the source electrode. A pixel electrode connects to the drain electrode and is disposed in the pixel region. An opaque metal pattern is provided on end portions of the pixel electrode.

In another aspect of the present disclosure, a method of fabricating an array substrate for a liquid crystal display (LCD) device includes forming a gate electrode on a substrate having a pixel region and a gate line connected to the gate electrode; forming an insulating layer on the gate electrode and the gate line, an active layer and an ohmic contact pattern on the insulating layer and corresponding to the gate electrode; forming source and drain electrodes on the ohmic contact pattern, the source electrode including a first source layer of a transparent conductive metallic material and a second source layer of an opaque conductive metallic material, the drain electrode includes a first drain layer of the transparent conductive metallic material and a second drain layer of the opaque conductive metallic material, forming a pixel region from a data line connected to the source electrode and that crosses the gate line, the pixel region being connected to the drain electrode and including a first pixel layer of the transparent conductive metallic material and a second pixel layer of the opaque conductive metallic material; and partially removing the second pixel layer through a fourth mask process to form a pixel electrode of the first pixel layer and an opaque metal pattern of the second pixel layer on end portions of the pixel electrode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION OF THE DRAWINGS AND THE PRESENTLY PREFERRED EMBODIMENTS

Reference will now be made in detail to the preferred embodiments, examples of which are illustrated in the accompanying drawings.

In an embodiment of the present disclosure, an array substrate is fabricated by a four mask process. The array substrate includes an active layer having an island shape on the gate electrode and a metal layer having a relatively small width at a boundary portion of a pixel electrode.

Figure 1:
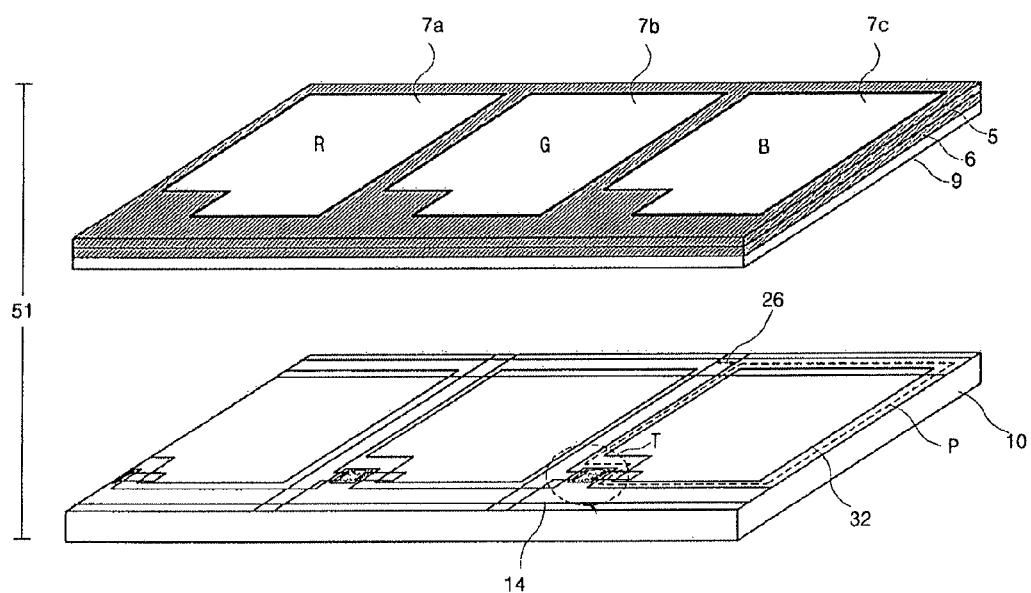
FIG. 1 is a schematic perspective view of a liquid crystal display (LCD) device according to the related art.
Figure 2:
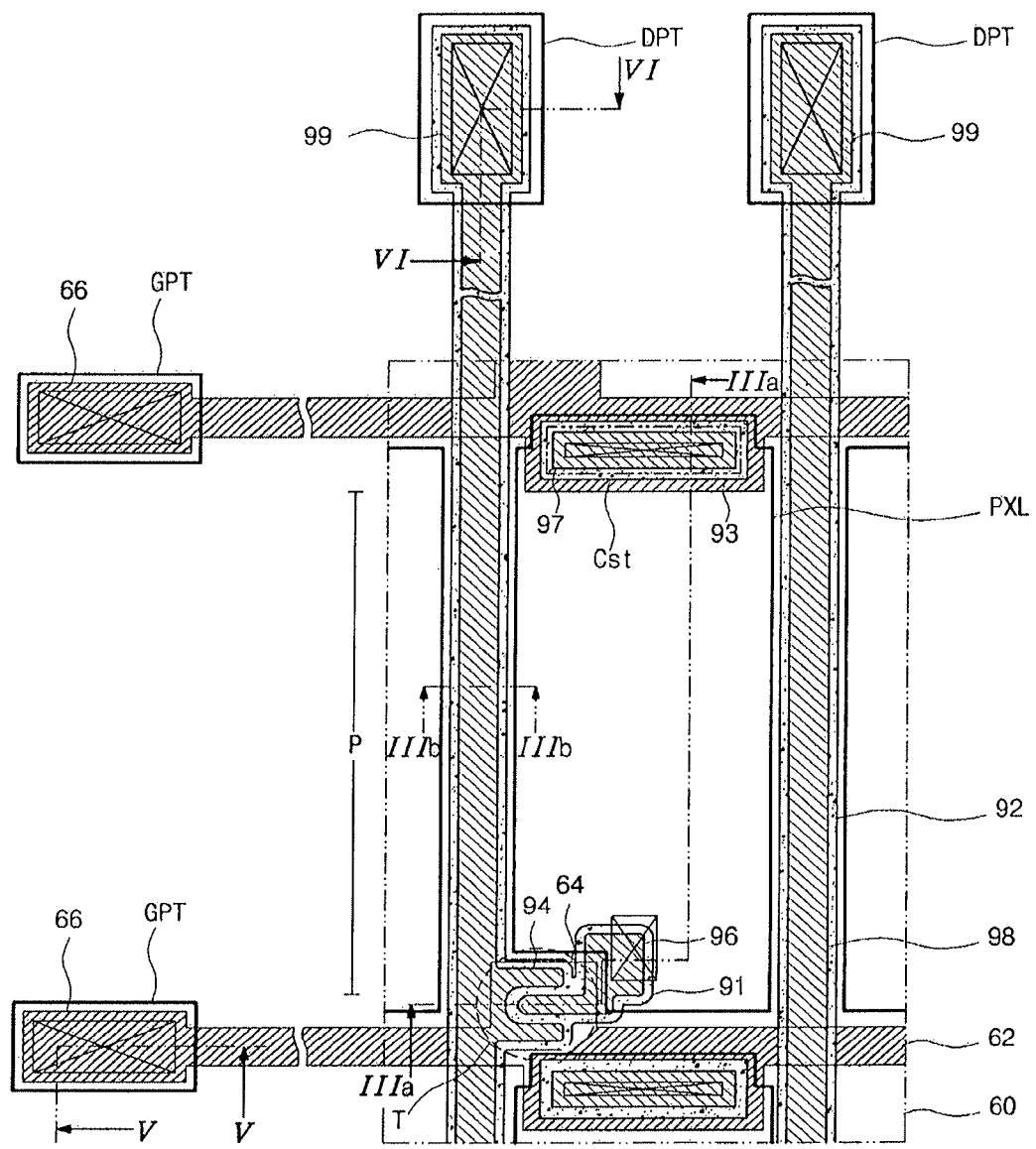
FIG. 2 is a plane view of one pixel region of the array substrate fabricated by a four mask process according to the related art.
Figure 3A:
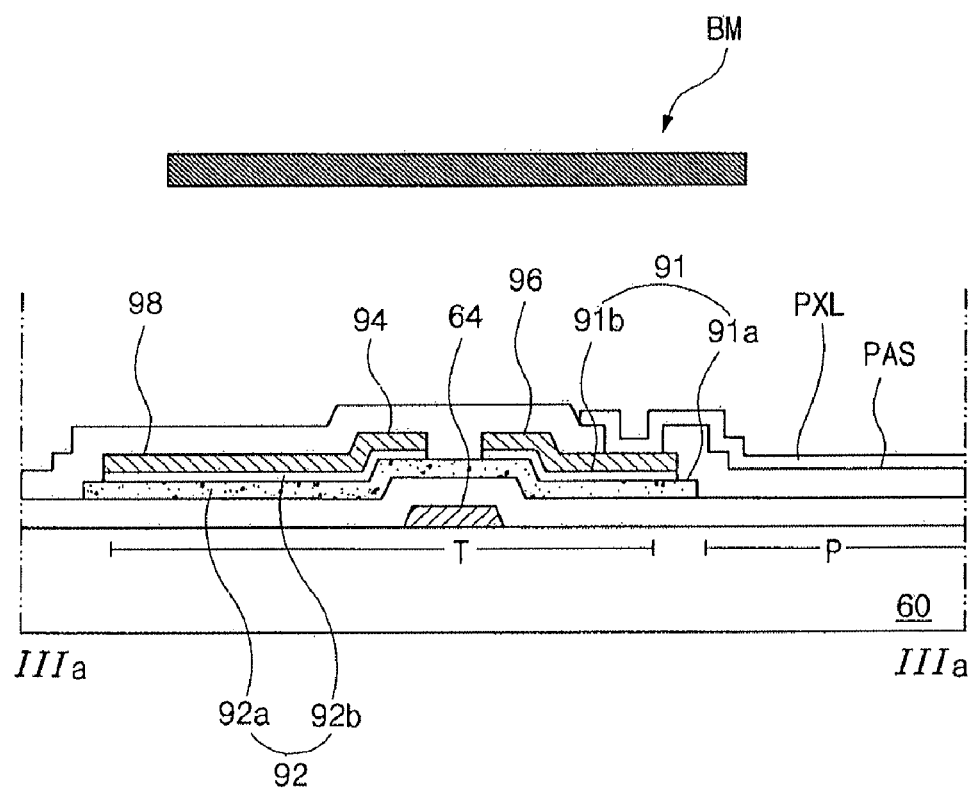
FIGS. 3A and 3B are cross-sectional views taken along the lines IIIa-IIIa and IIIb-IIIb of FIG. 2, respectively.
Figure 3B:
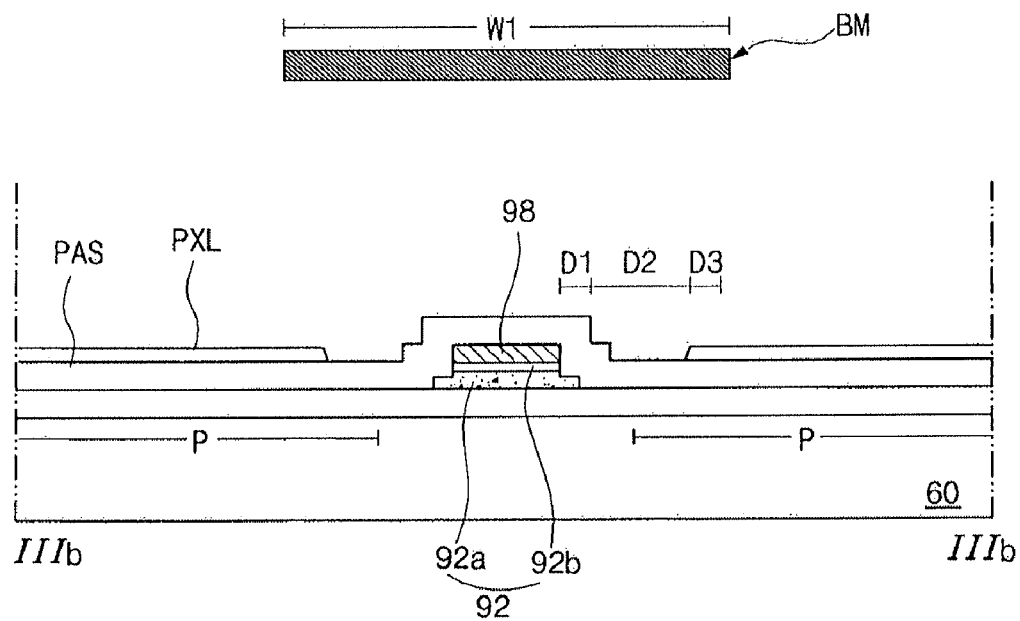
Figure 4A:
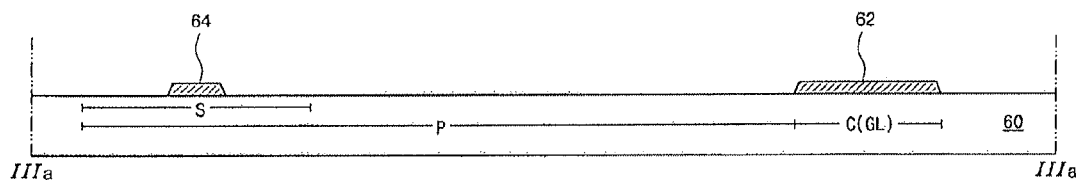
FIGS. 4A to 4G are cross-sectional views showing a fabrication process of a portion taken along the line IIIa-IIIa of FIG. 2.
Figure 4B:
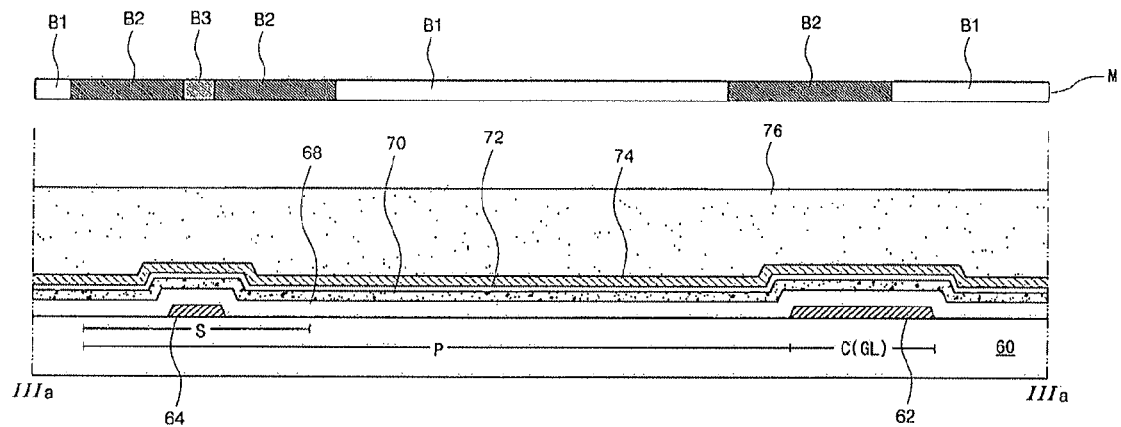
Figure 4C:
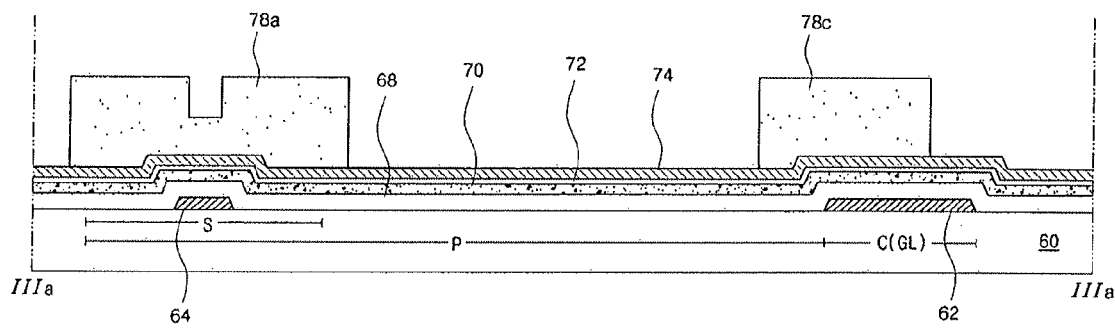
Figure 4D:
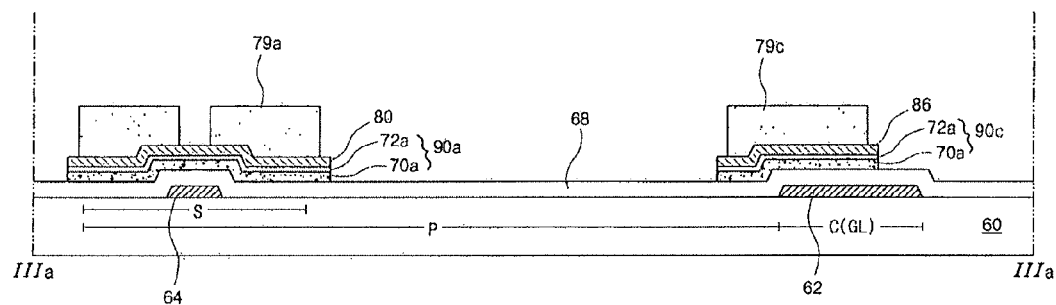
Figure 4E:
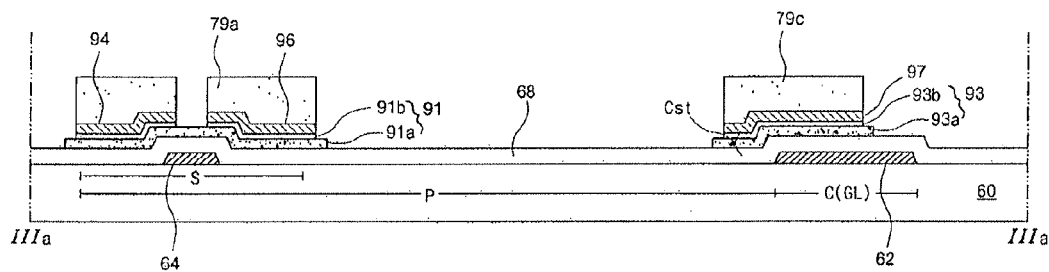
Figure 4F:
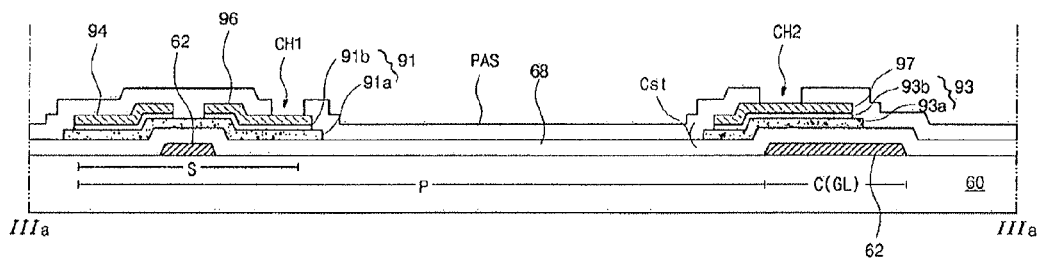
Figure 4G:
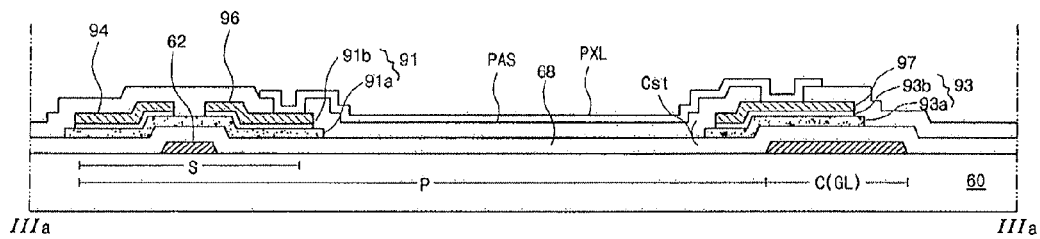
Figure 5A:
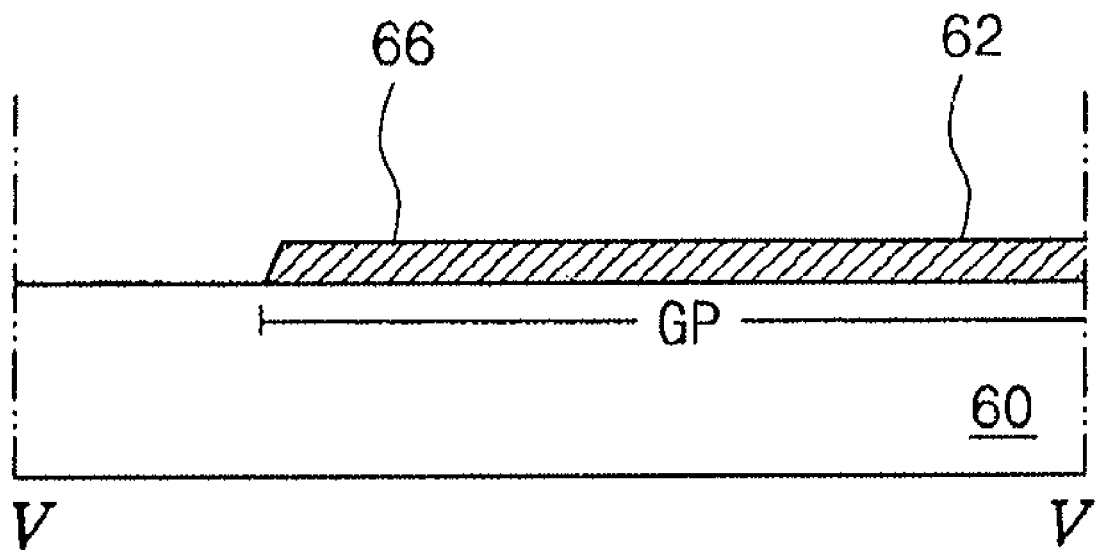
FIGS. 5A to 5G are cross-sectional views showing a fabrication process of a portion taken along the line V-V of FIG. 2.
Figure 5B:
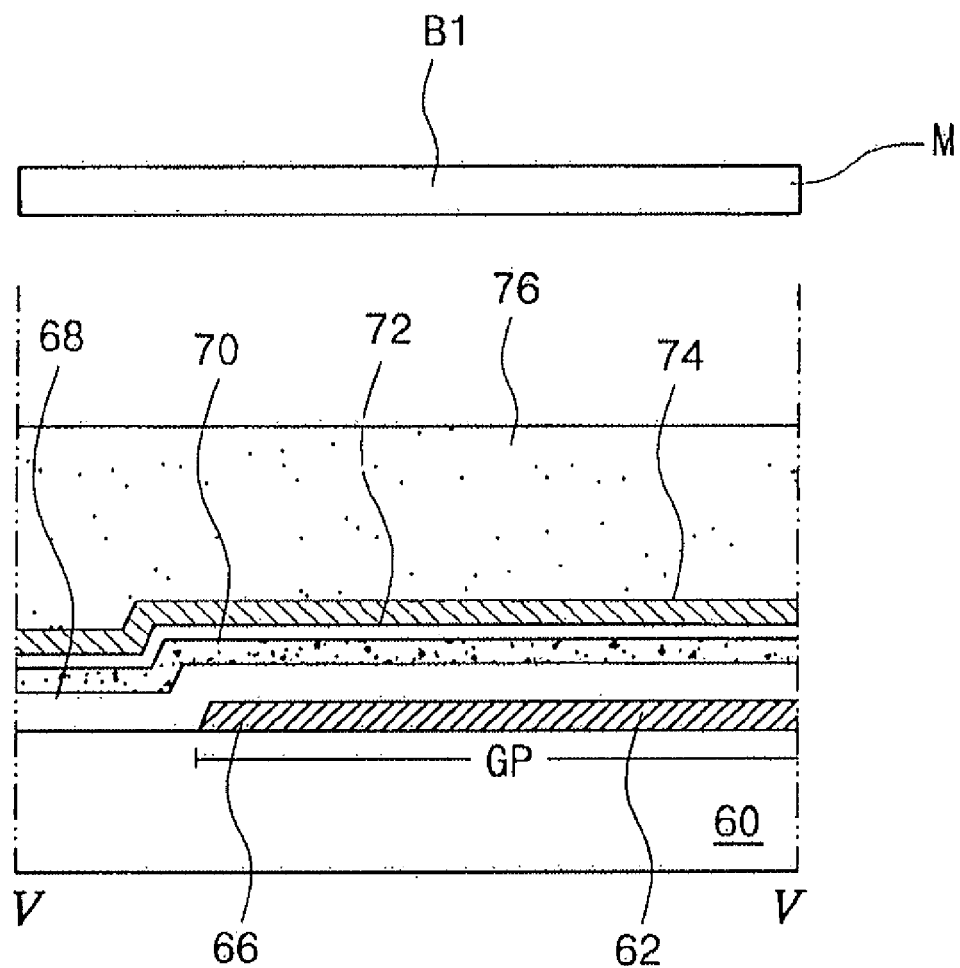
Figure 5C:
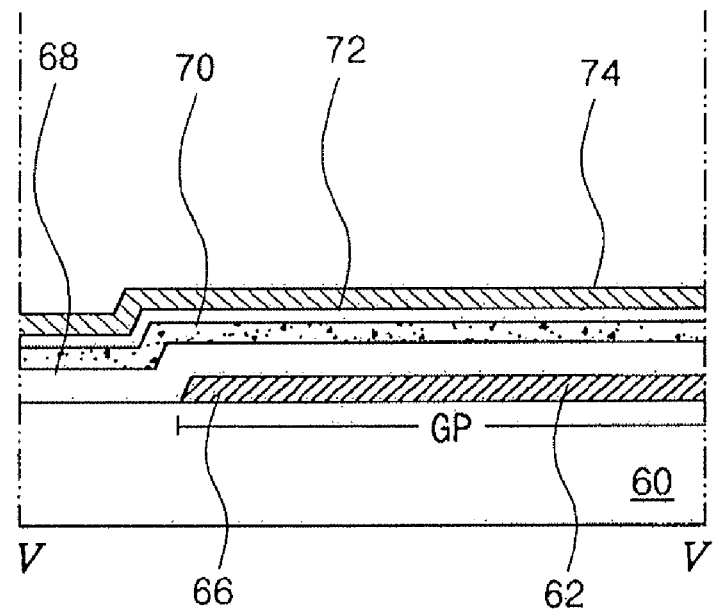
Figure 5D:
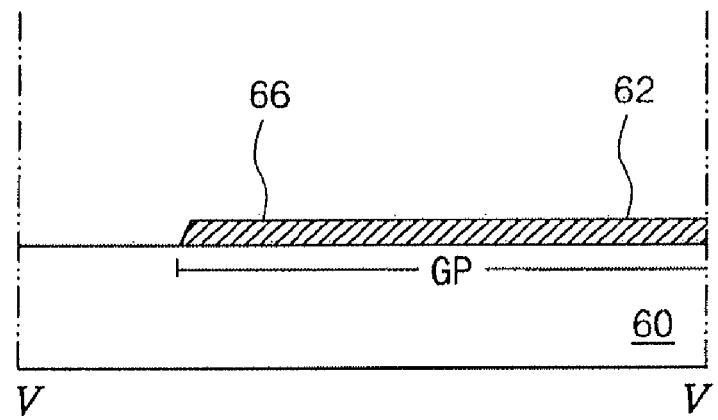
Figure 5E:
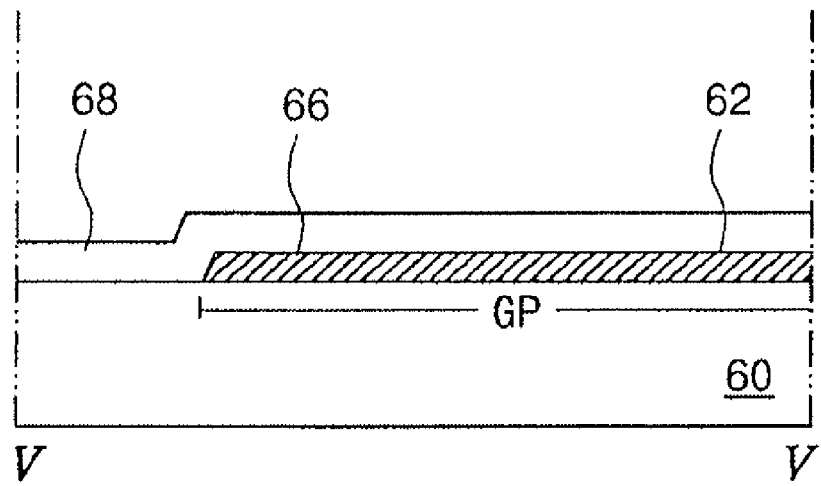
Figure 5F:
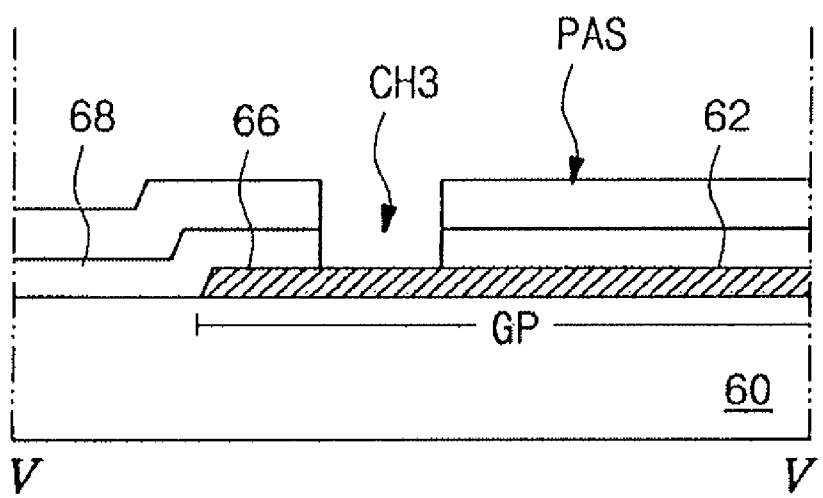
Figure 5G:
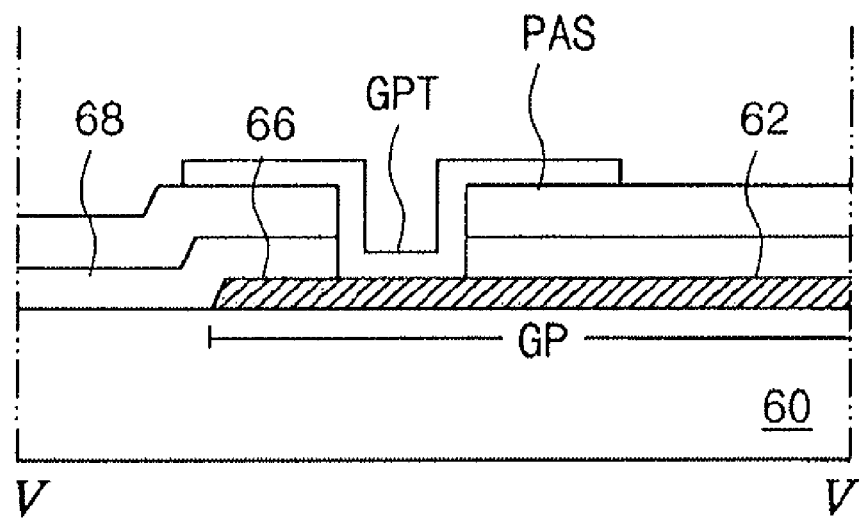
Figure 6A:
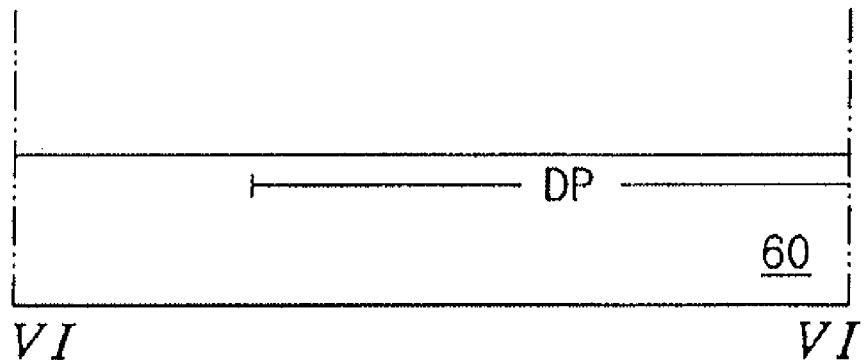
FIGS. 6A to 6G are cross-sectional views showing a fabrication process of a portion taken along the line VI-VI of FIG. 2.
Figure 6B:
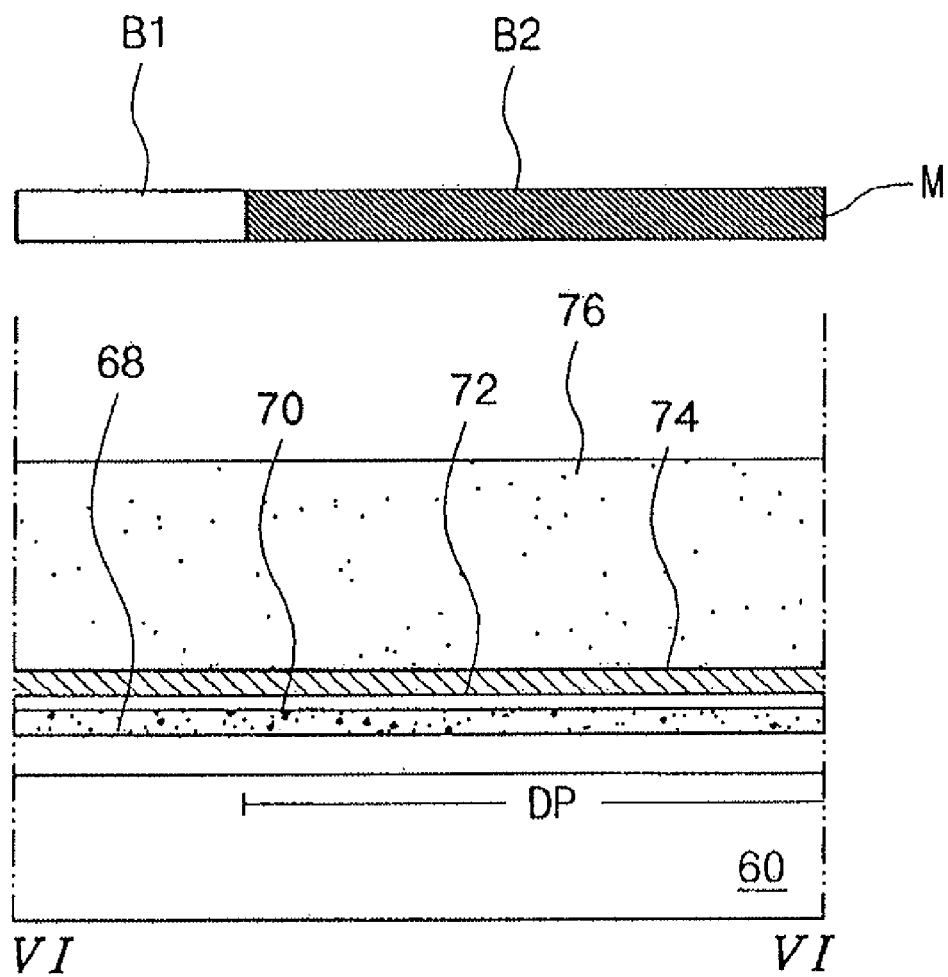
Figure 6C:
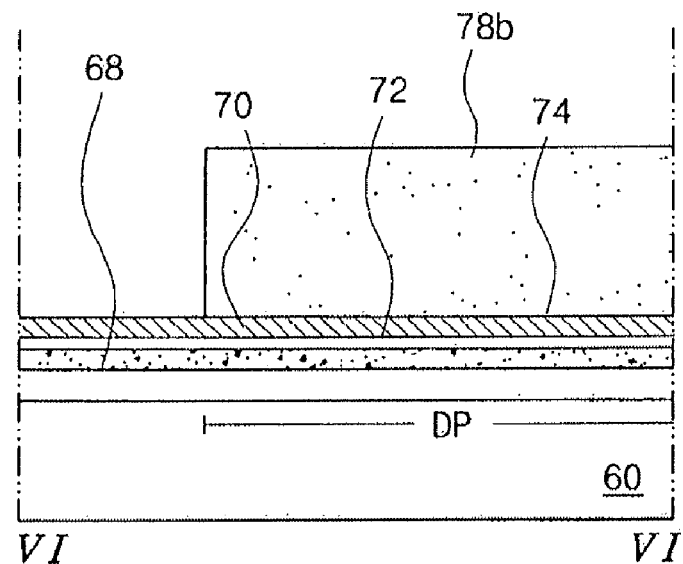
Figure 6D:
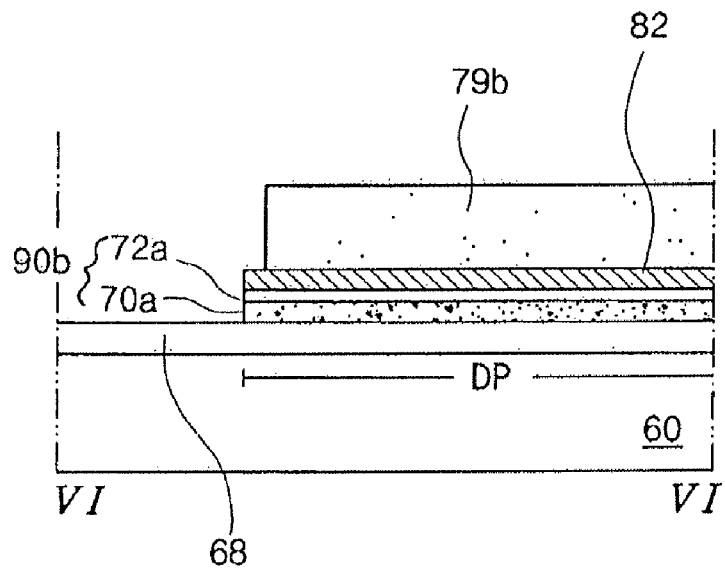
Figure 6E:
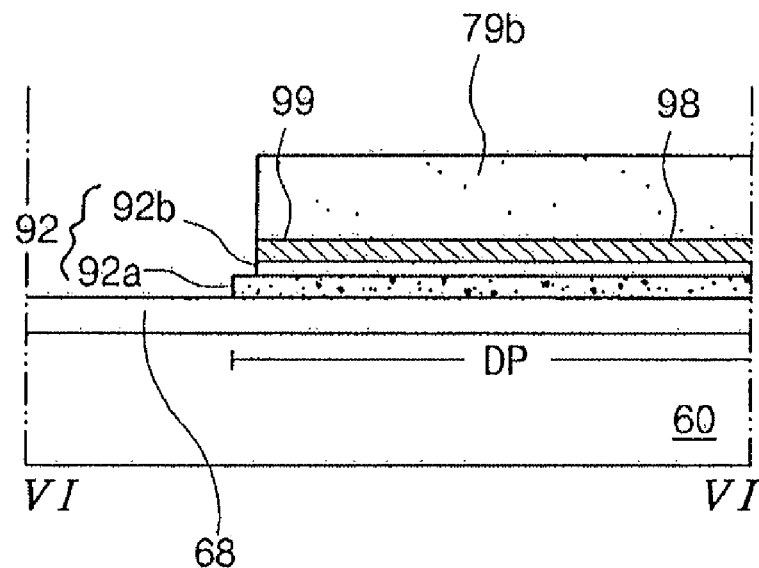
Figure 6F:
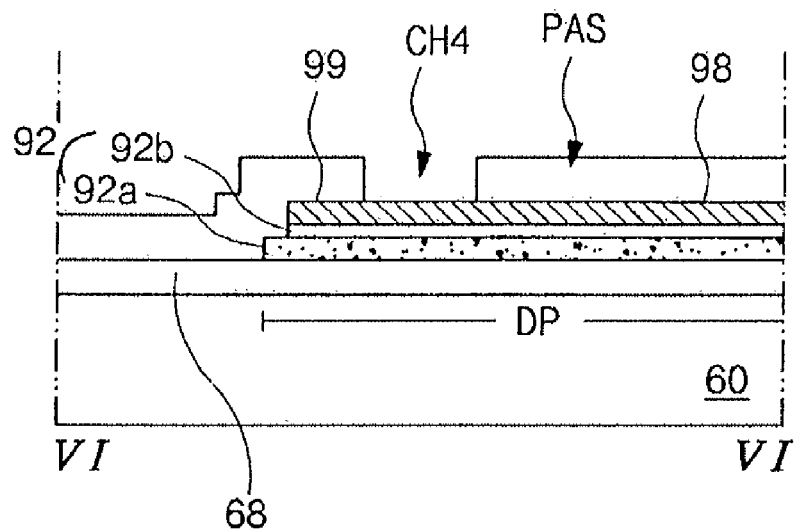
Figure 6G:
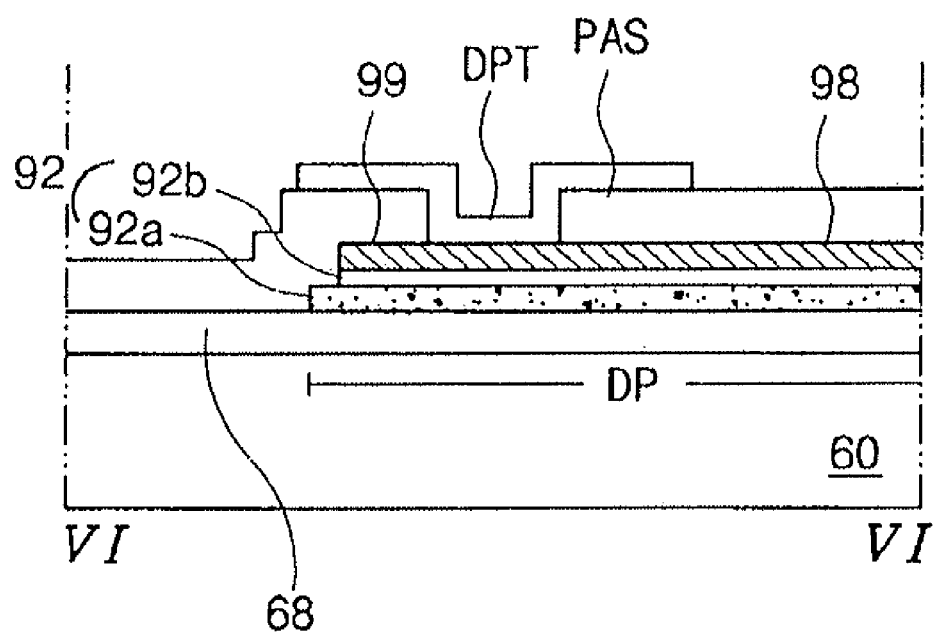
Figure 7:
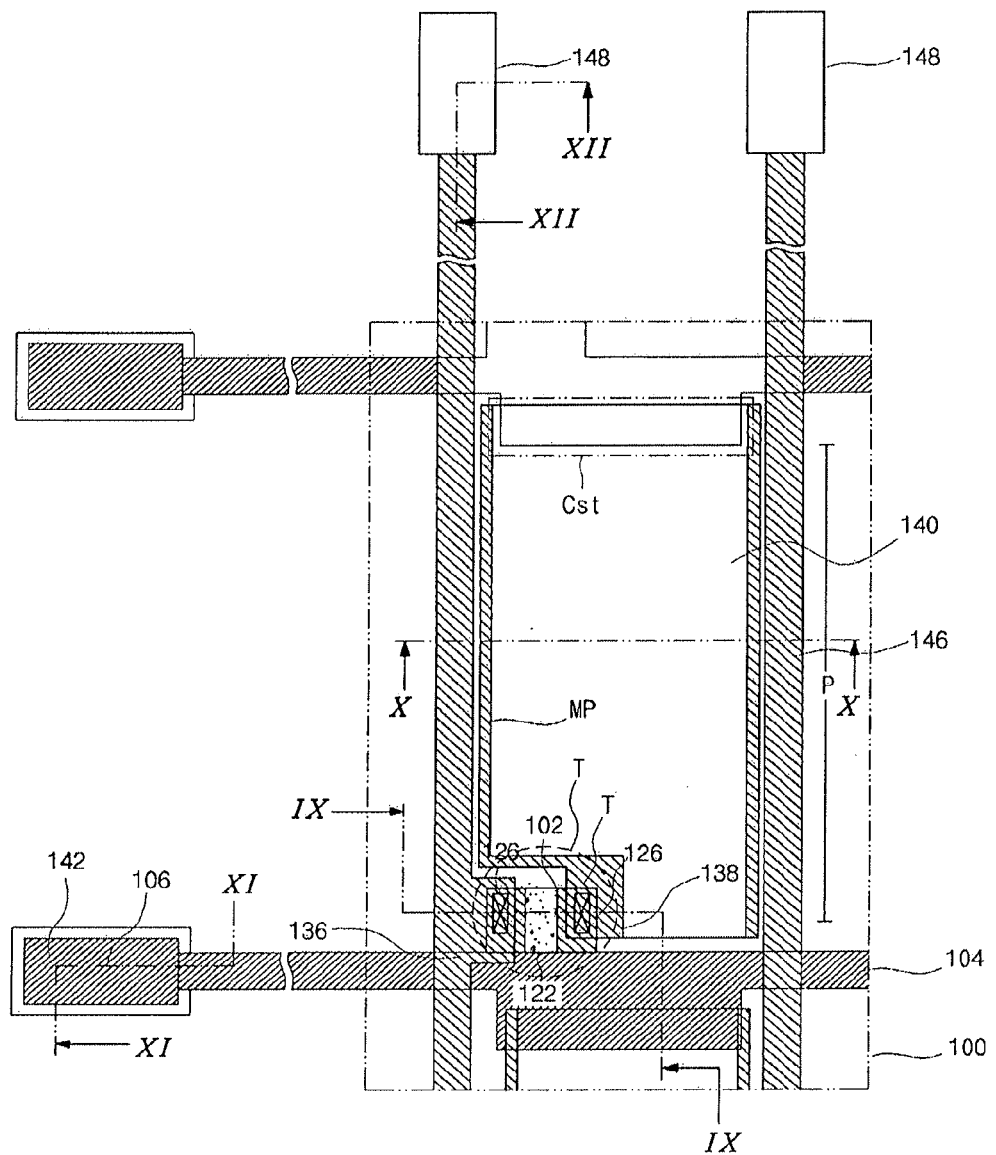
FIG. 7 is a plane view of one pixel region of an array substrate according to an exemplary embodiment of the present disclosure.

FIG. 7 is a plane view of one pixel region of an array substrate according to an exemplary embodiment of the present disclosure. As shown in FIG. 7, a gate line 104 and a data line 146 cross each other on a substrate 100 to define a pixel region P. A gate pad 106 and a data pad 148 are formed at respective ends of the gate and data lines 104, 146, respectively. A transparent gate pad terminal 142 is formed on and contacts the gate pad 106. A thin film transistor (TFT) T is connected to the gate line 104 and to the data line 146. The TFT T includes a gate electrode 102, an active layer 122, an ohmic contact layer (not shown), a buffer metal layer 126, a source electrode 136 and a drain electrode 138. The gate electrode 102 and the source electrode 136 are connected to gate line 104 and the data line 146, respectively. The buffer metal layer 126 is formed between the ohmic contact layer and each of the source and drain electrodes 136, 138.

A pixel electrode 140 is connected to and extends from the drain electrode 138. The pixel electrode 140 is disposed in the pixel region P. An opaque metal pattern MP is formed in a boundary portion of the pixel electrode 140 to minimize an alignment error of a black matrix (not shown) and increase aperture ratio. Moreover, since the pixel electrode has a relatively low resistance due to the opaque metal pattern MP, the pixel electrode can have a relatively thin thickness such that transmittance is improved.

The gate line 104 and the pixel electrode 140 overlap each other to constitute a storage capacitor Cst such that an overlapped portion of the gate line 104 and an overlapped portion of the pixel electrode 140 function as a first storage electrode and a second storage electrode, respectively. The above-mentioned array substrate for the LCD device is fabricated by the four mask process. However, unlike the related art, a semiconductor layer does not exist under the data line 146.

Figure 8A:
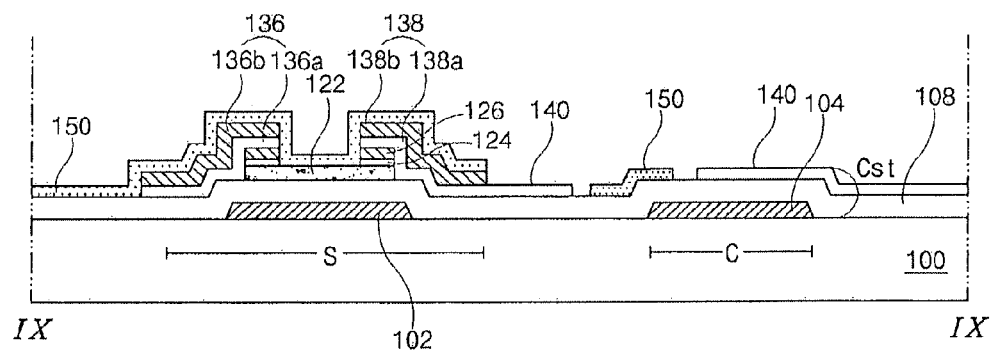
FIGS. 8A to 8D are cross-sectional views taken along the lines VIIIa-VIIIa, VIIIb-VIIIb, VIIIc-VIIIc and VIIId-VIIId of FIG. 7, respectively.
Figure 8B:
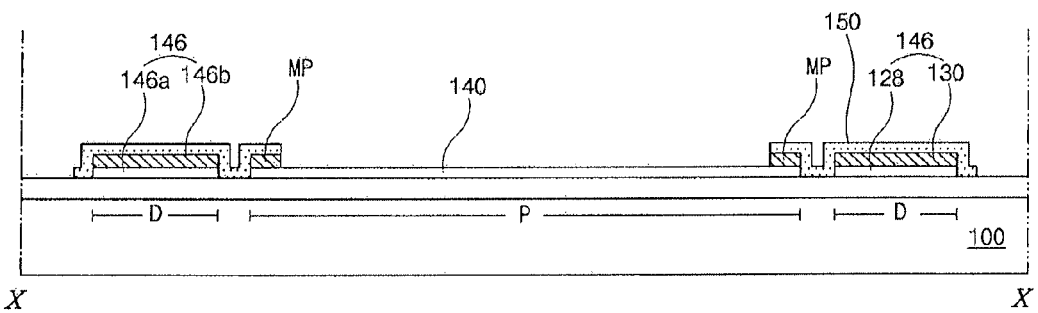
Figure 8C:
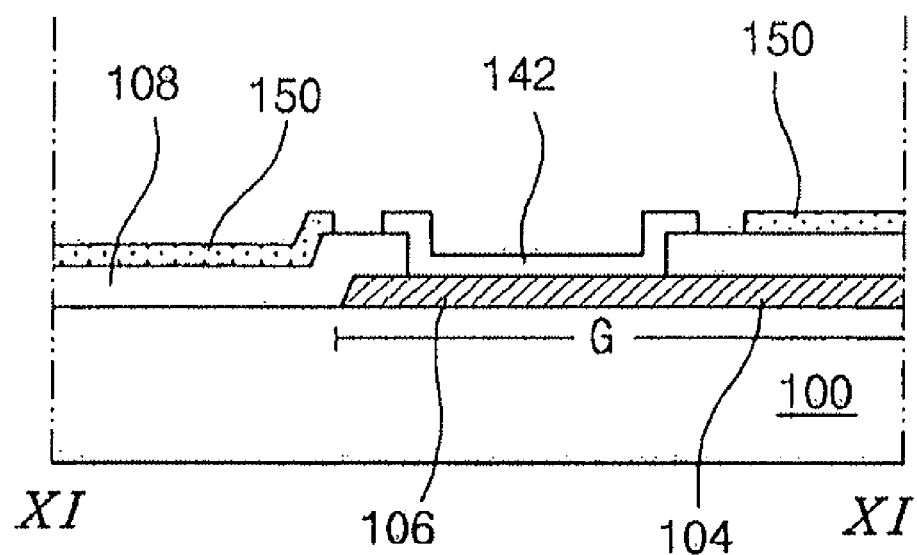
Figure 8D:
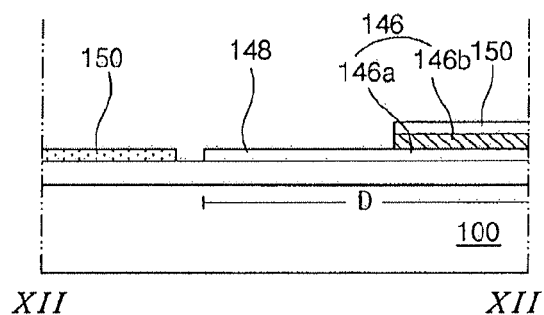
Figure 9A:
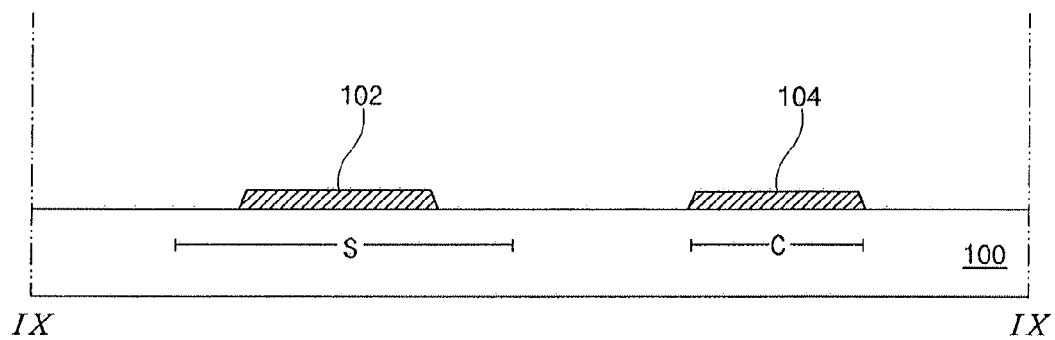
FIGS. 9A to 9L are cross-sectional views showing a fabrication process of a portion taken along the line VIIIa-VIIIa of FIG. 7.
Figure 9B:
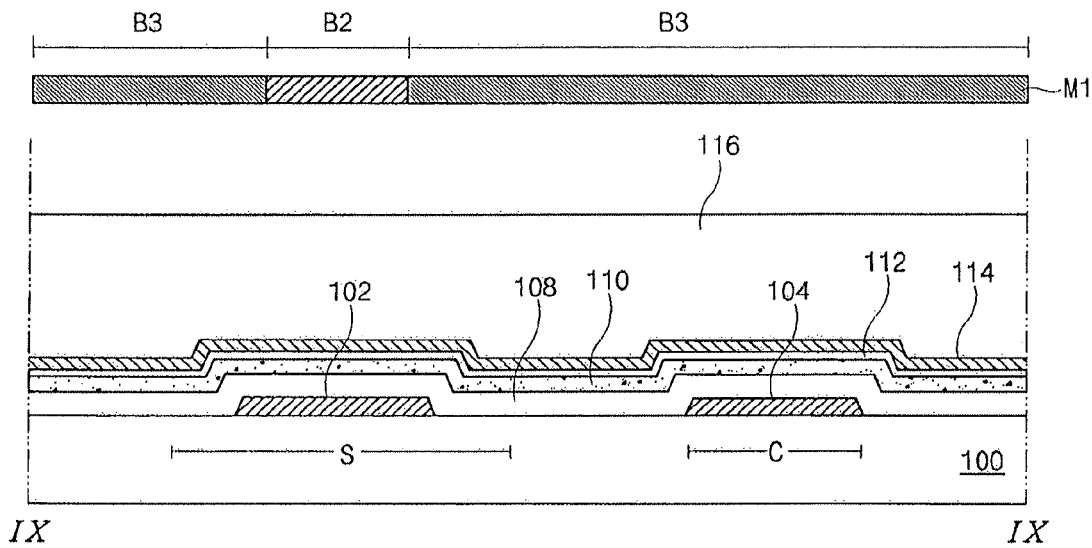
Figure 9C:
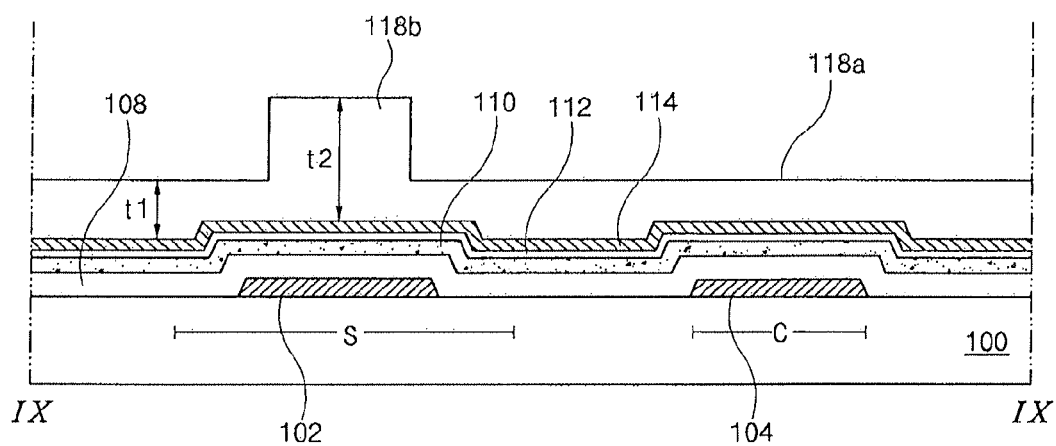
Figure 9D:
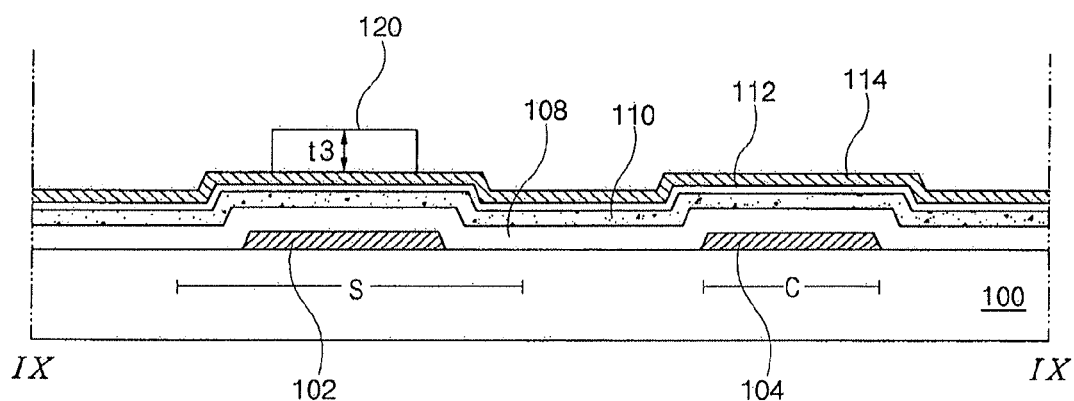
Figure 9E:
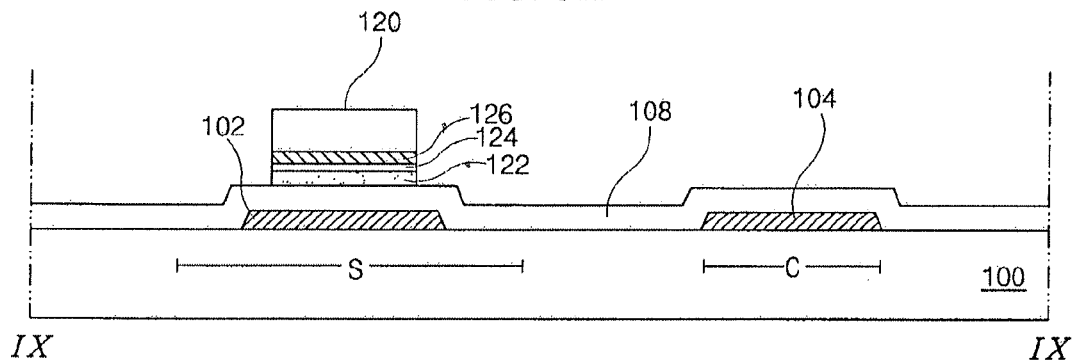
Figure 9F:
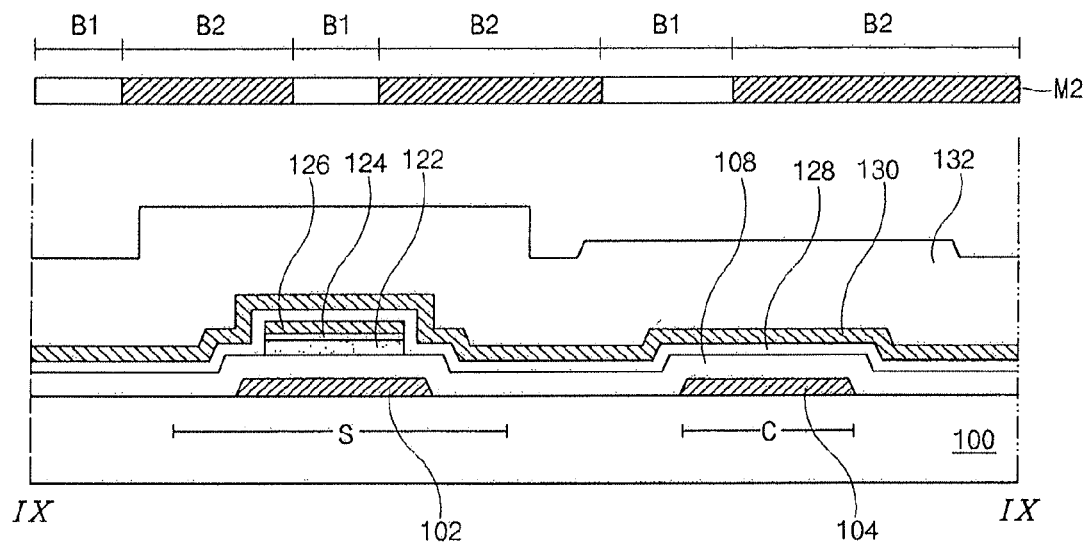
Figure 9G:
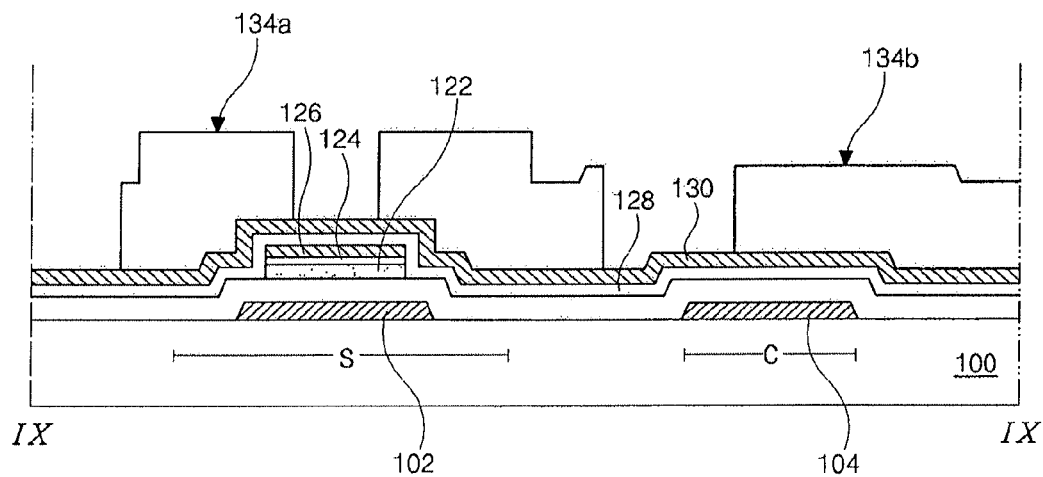
Figure 9H:
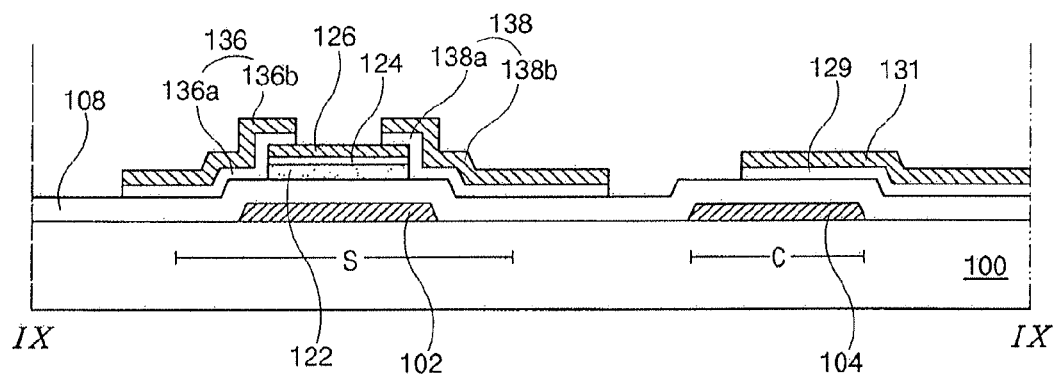
Figure 9I:
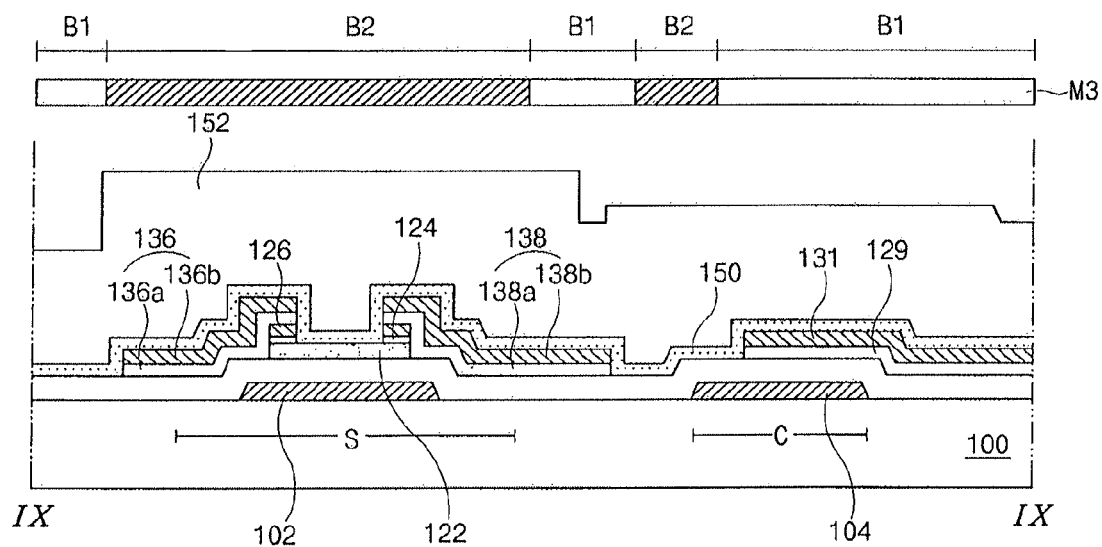
Figure 9J:
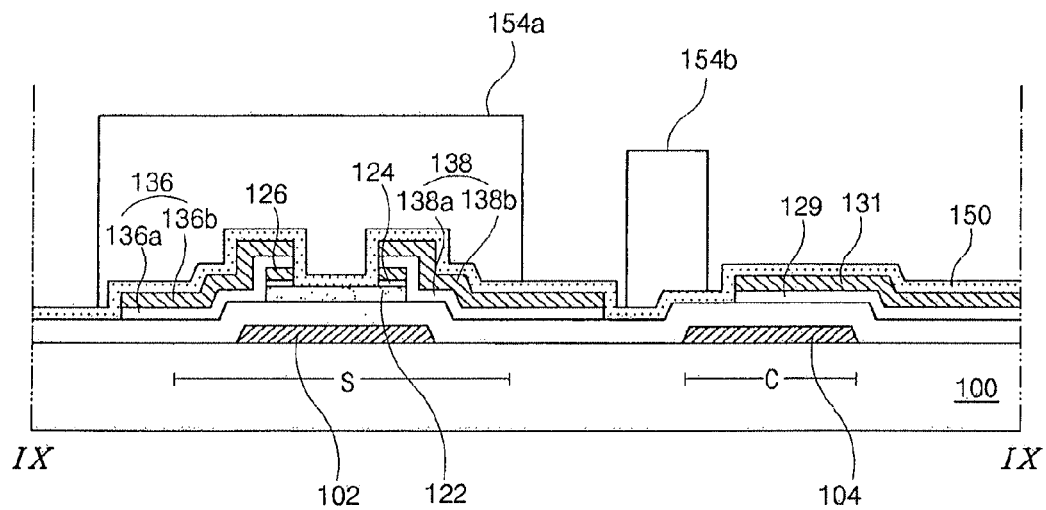
Figure 9K:
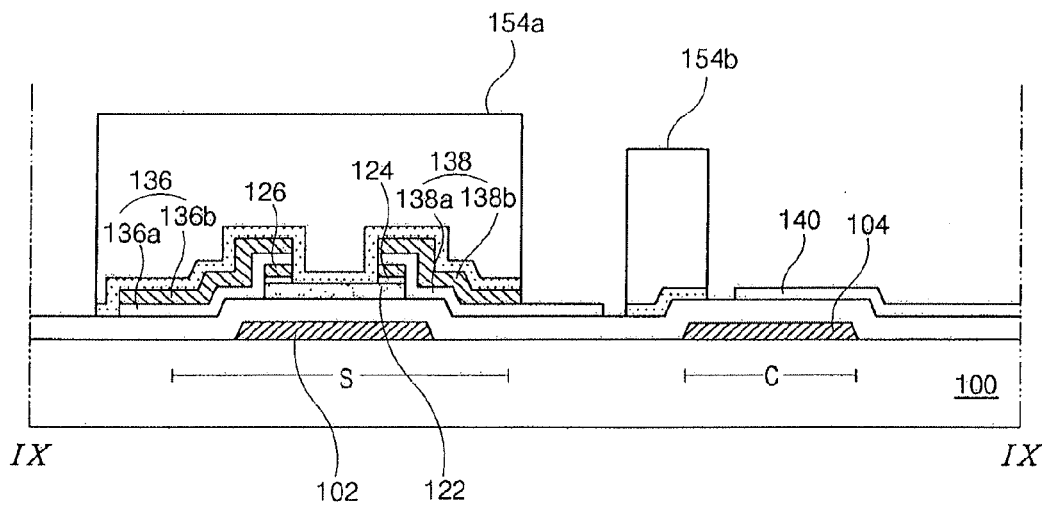
Figure 9L:
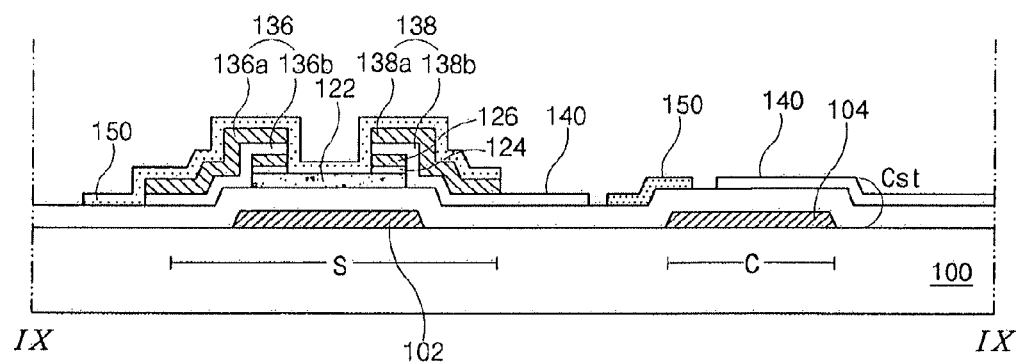
Figure 10A:
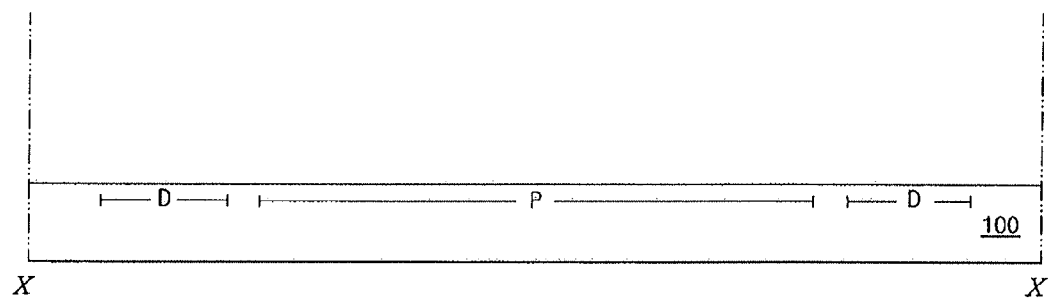
FIGS. 10A to 10L are cross-sectional views showing a fabrication process of a portion taken along the line VIIIb-VIIIb of FIG. 7.
Figure 10B:
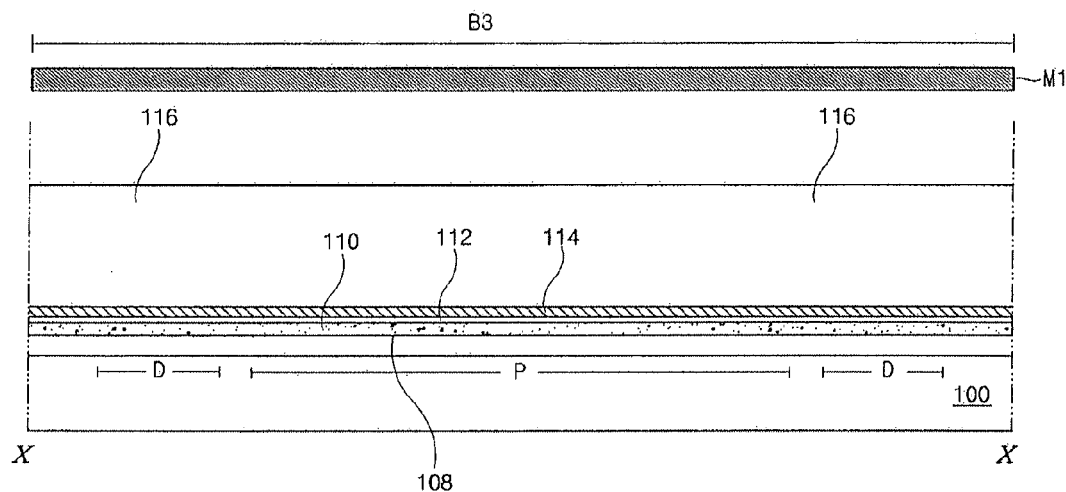
Figure 10C:
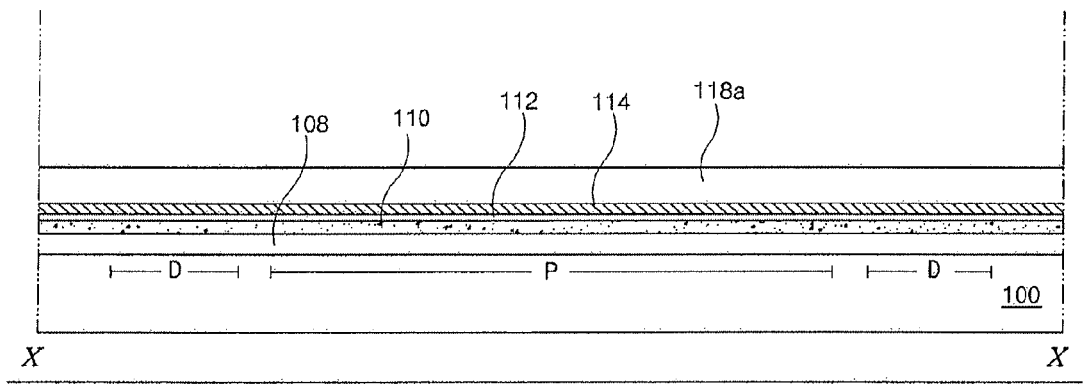
Figure 10D:
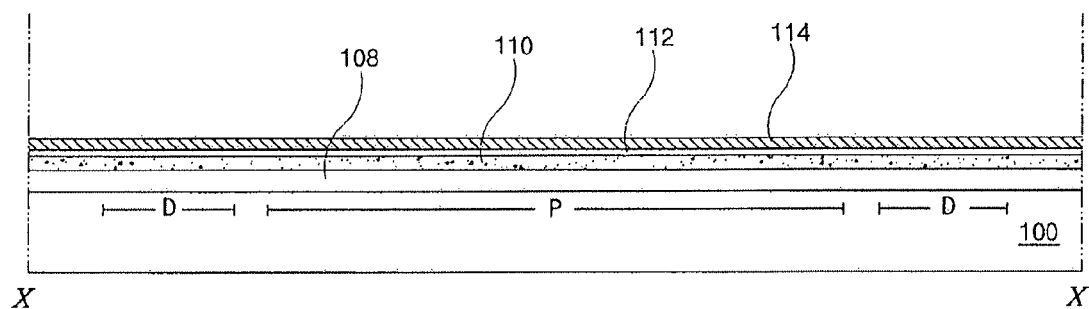
Figure 10E:
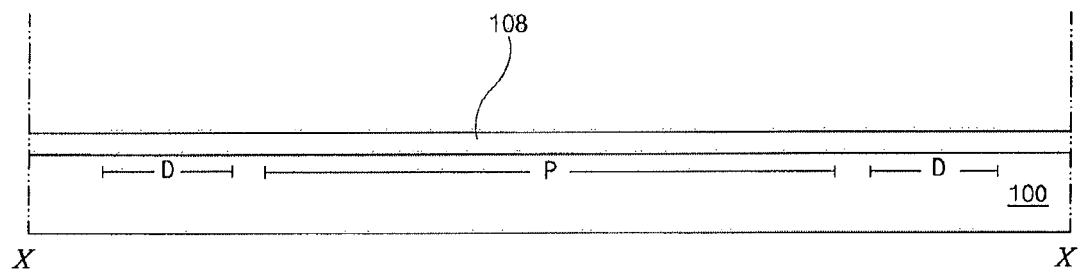
Figure 10F:
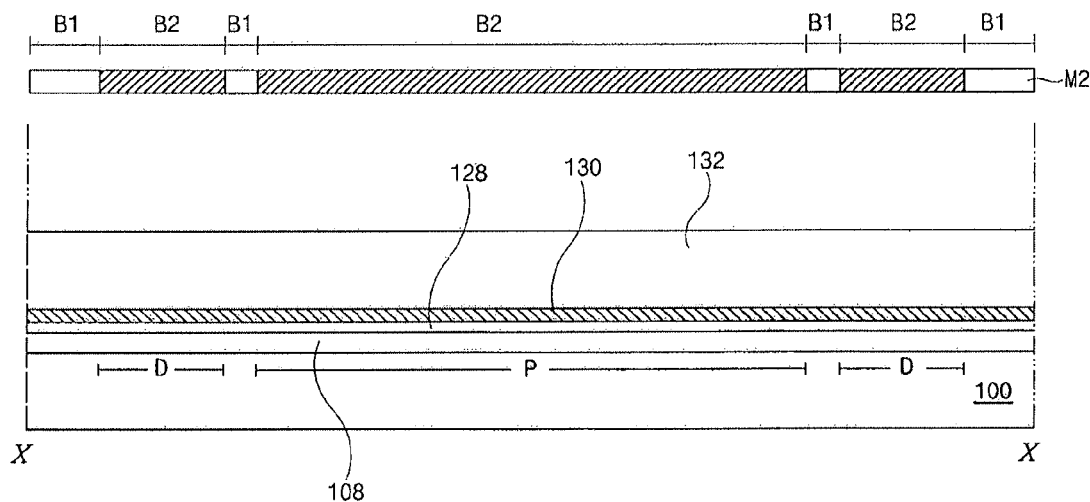
Figure 10G:
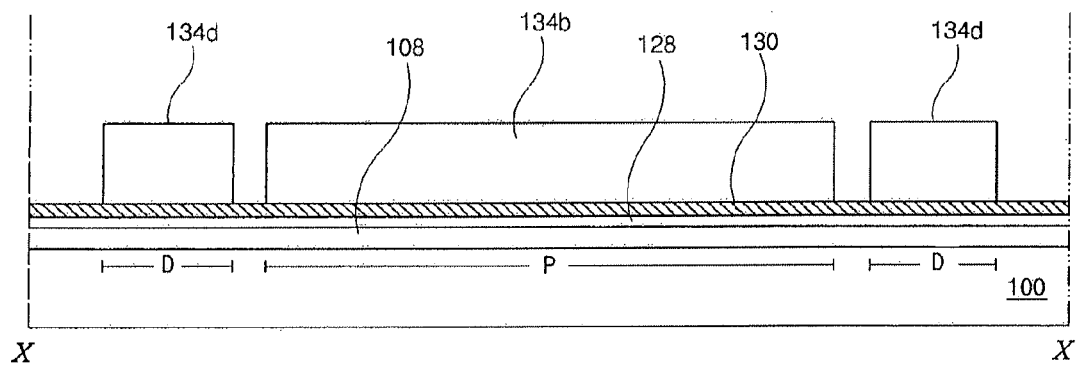
Figure 10H:
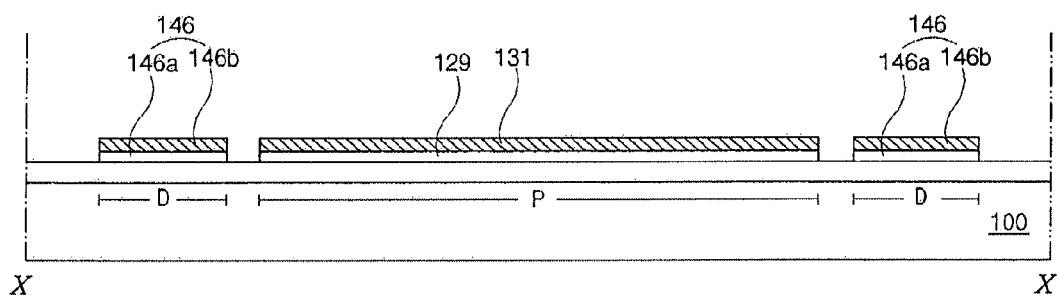
Figure 10I:
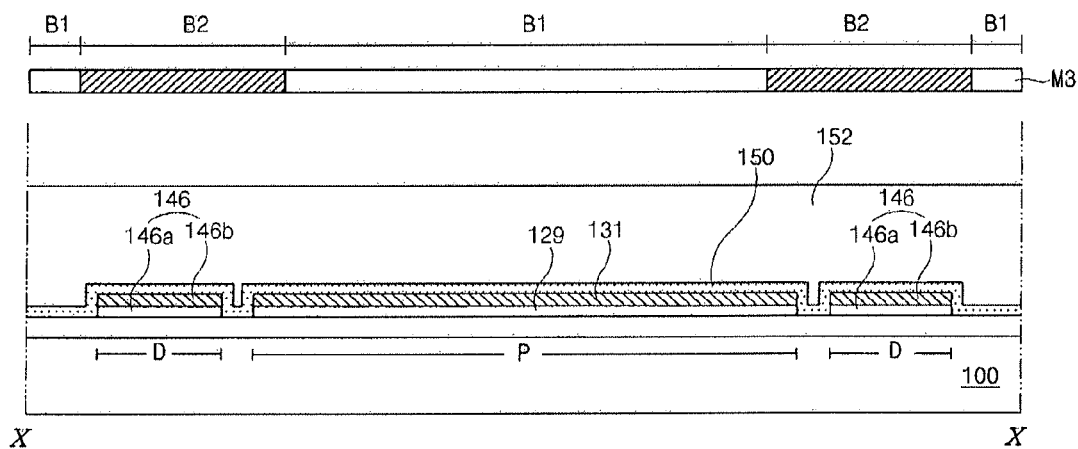
Figure 10J:
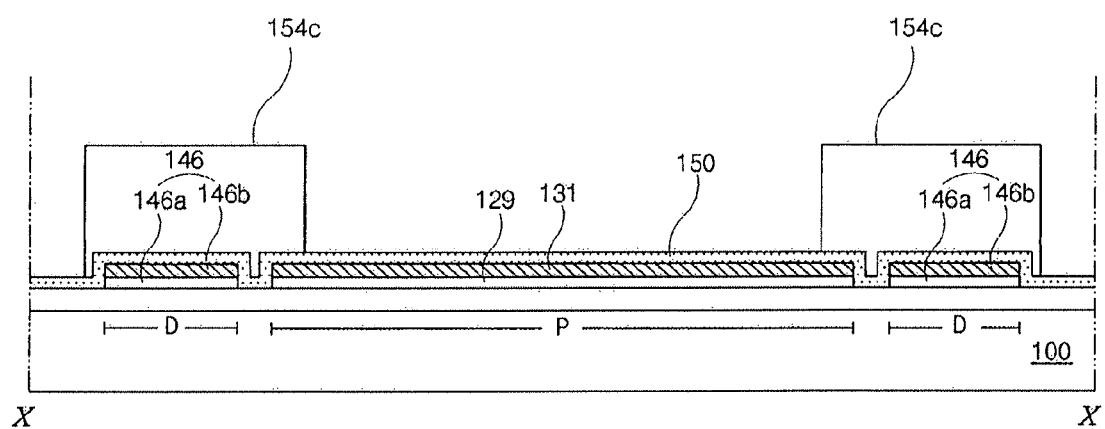
Figure 10K:
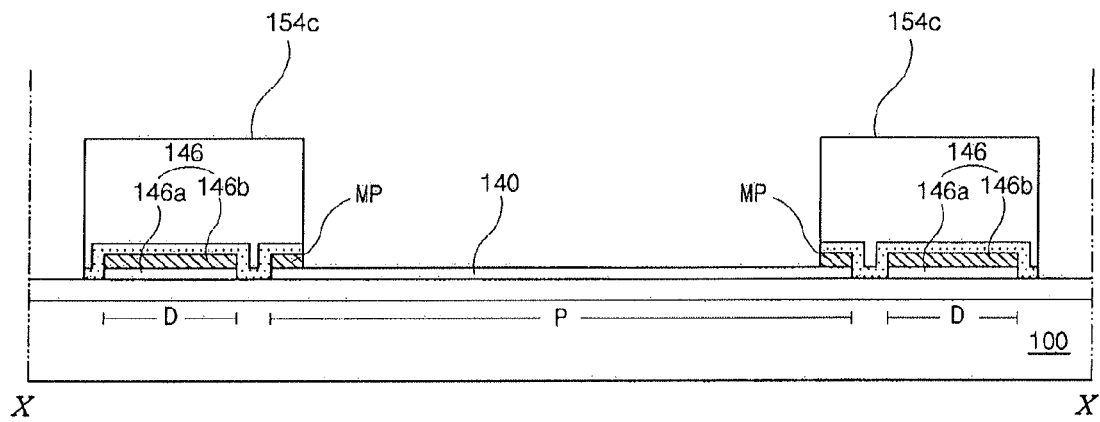
Figure 10L:
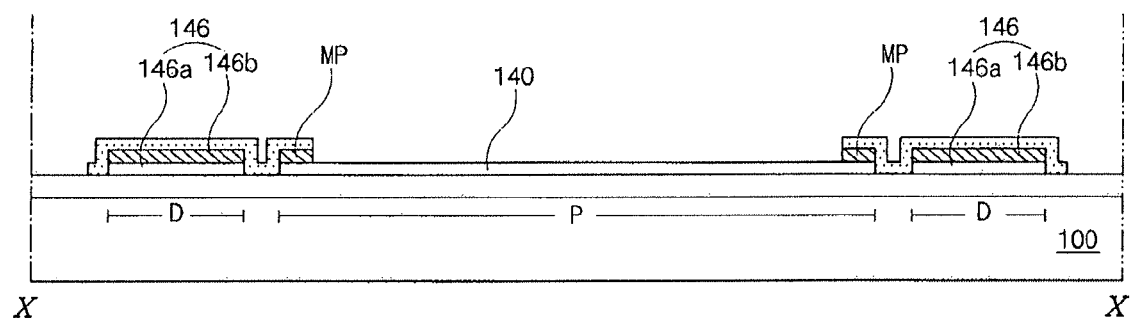
Figure 11A:
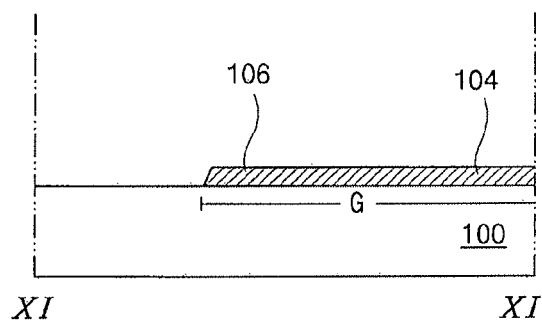
FIGS. 11A to 11L are cross-sectional views showing a fabrication process of a portion taken along the line VIIIc-VIIIc of FIG. 7.
Figure 11B:
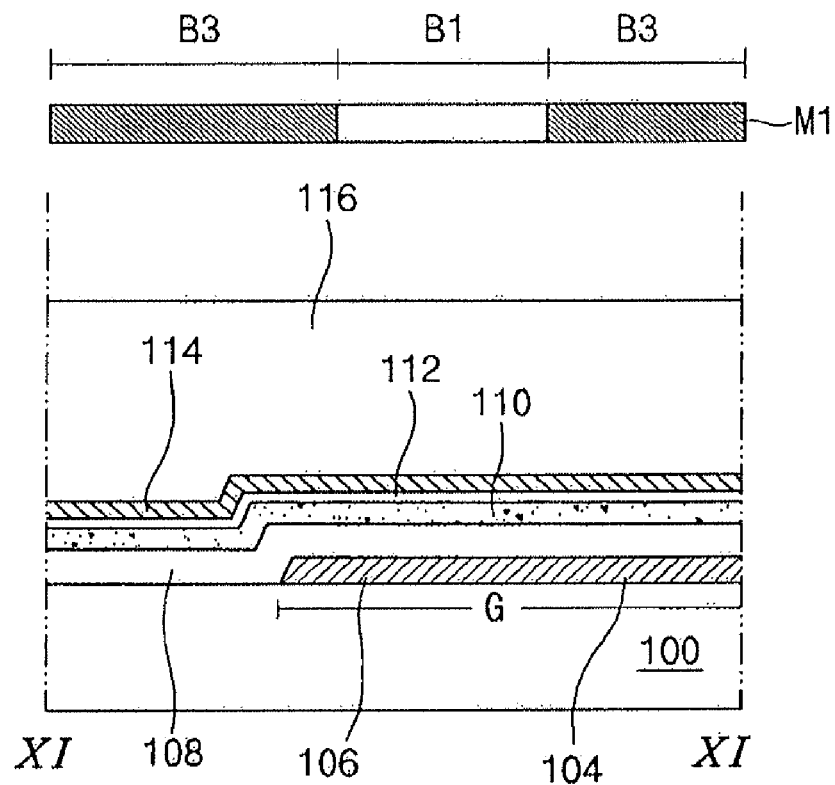
Figure 11C:
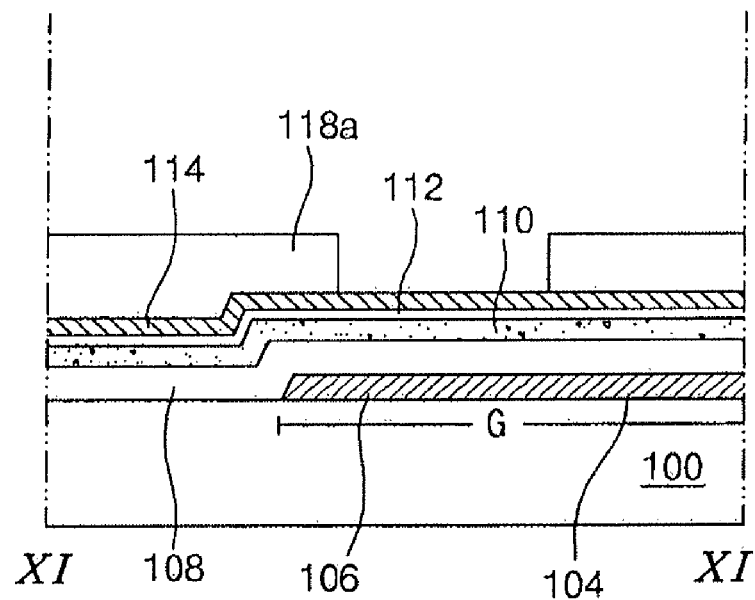
Figure 11D:
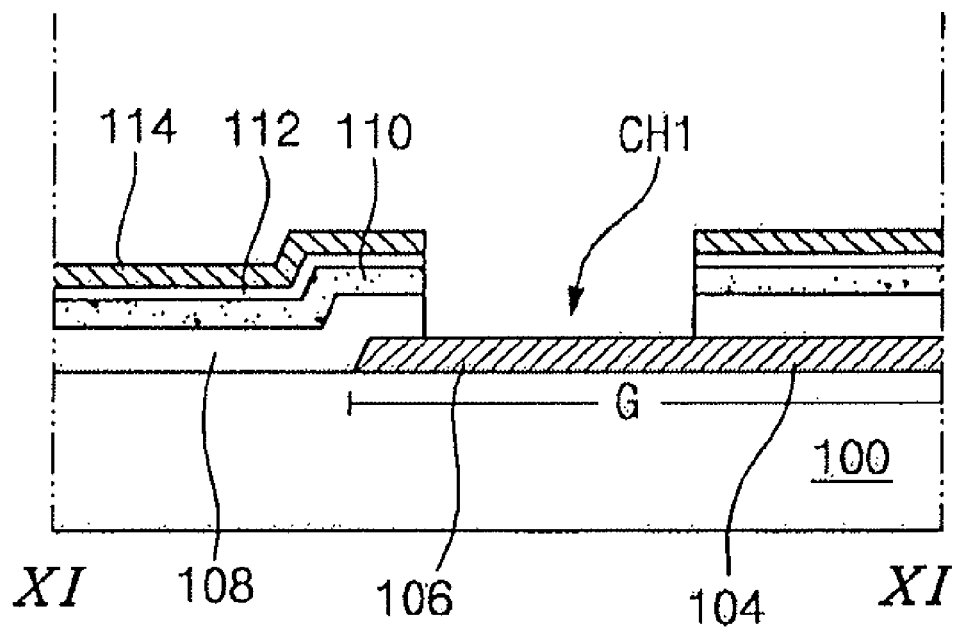
Figure 11E:
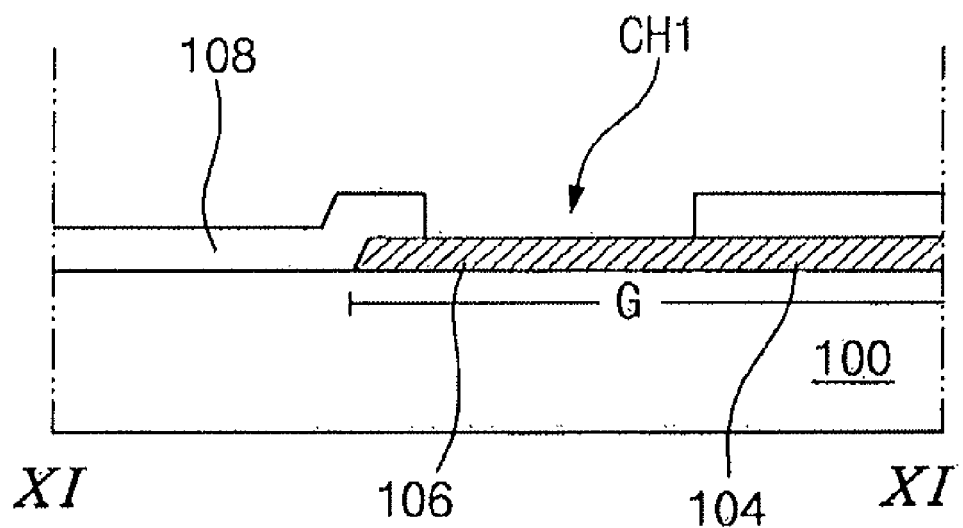
Figure 11F:
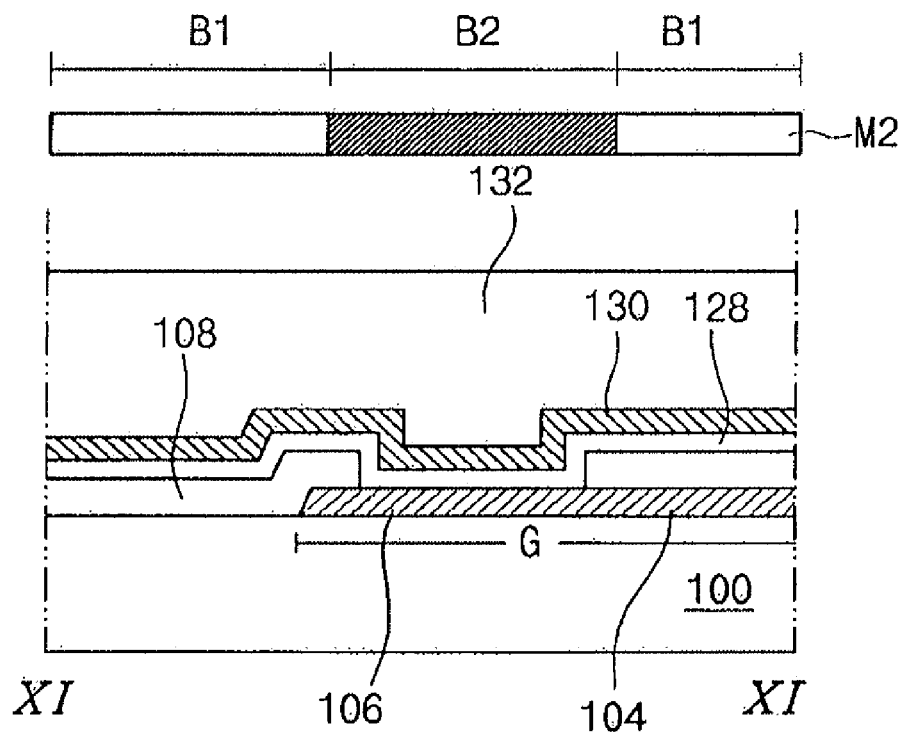
Figure 11G:
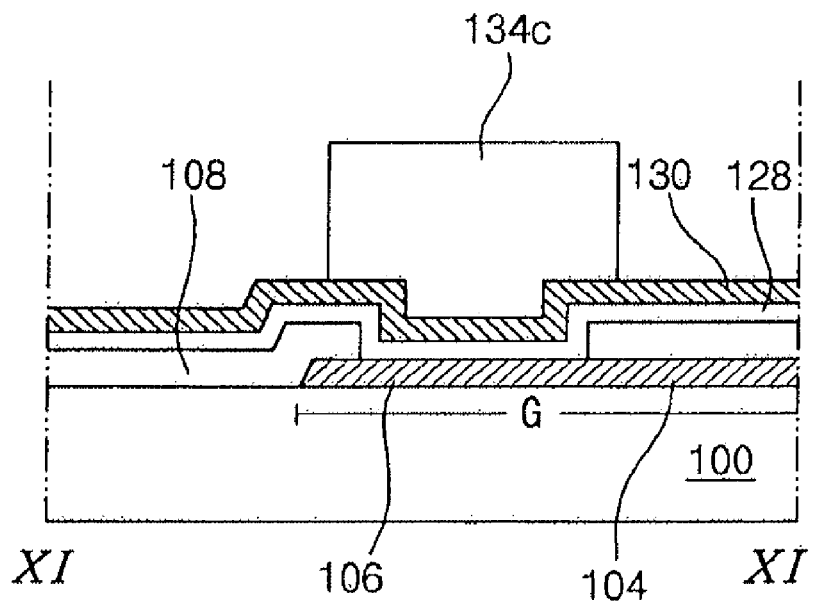
Figure 11H:
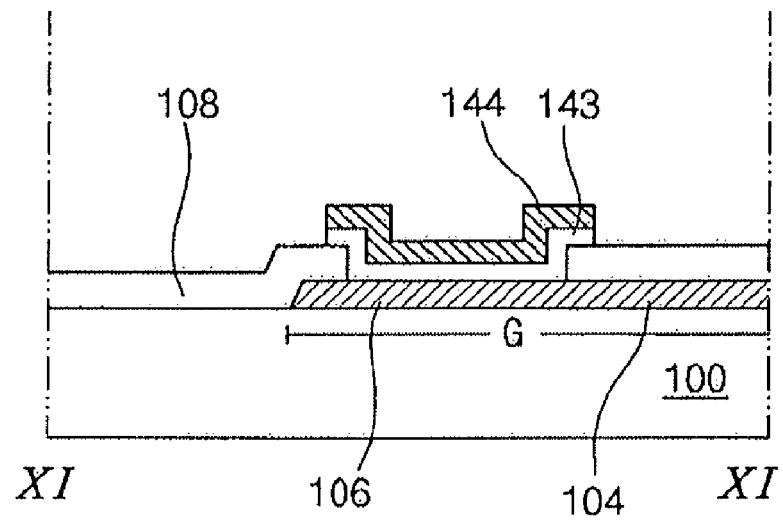
Figure 11I:
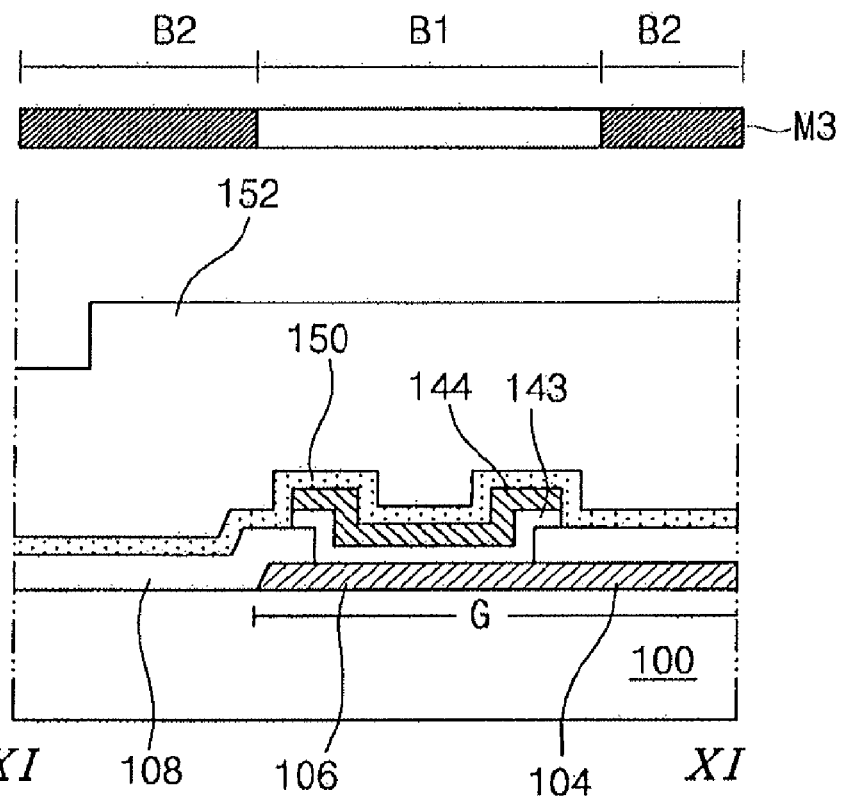
Figure 11J:
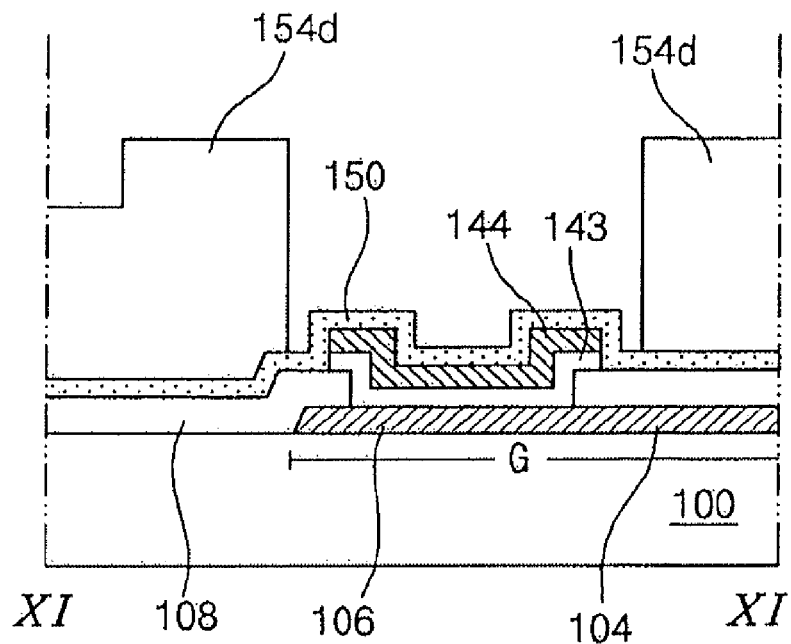
Figure 11K:
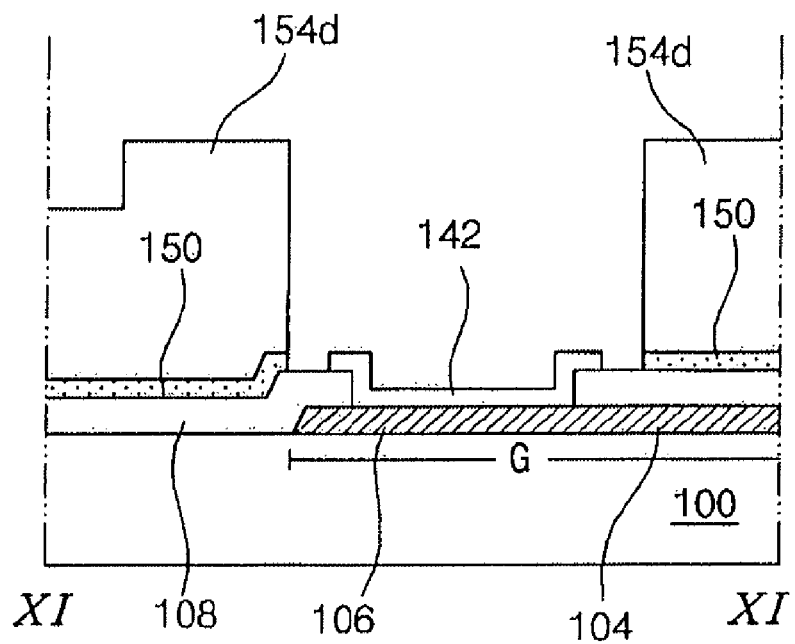
Figure 11L:
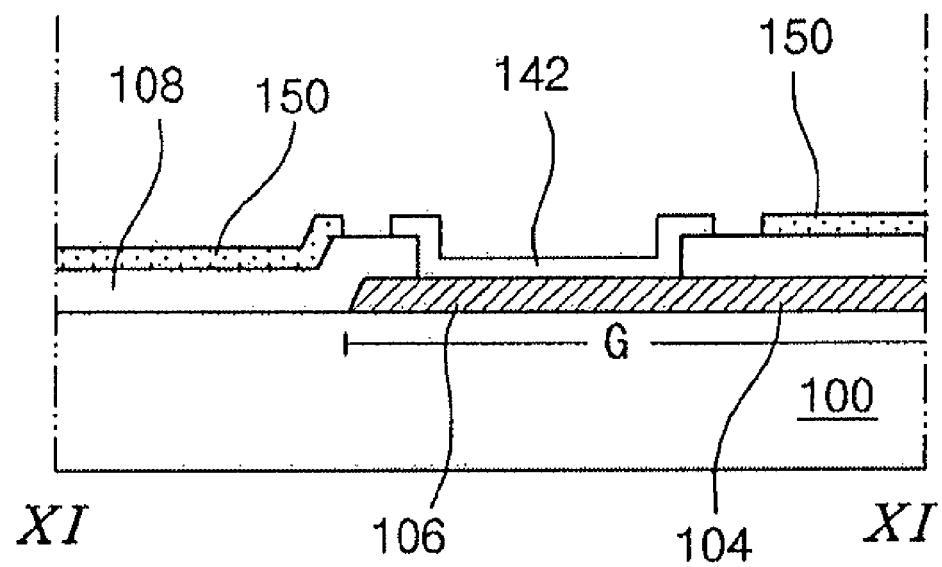
Figure 12A:
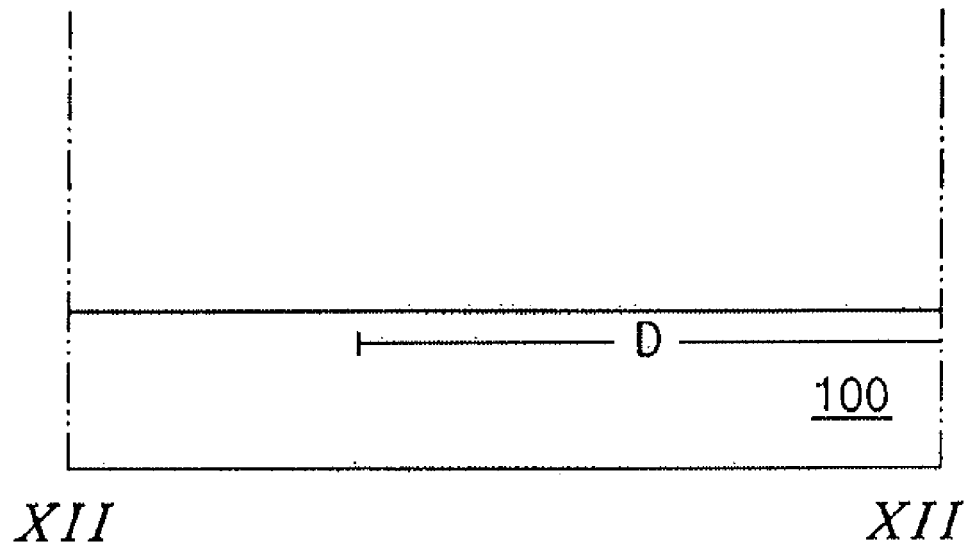
FIGS. 12A to 12L are cross-sectional views showing a fabrication process of a portion taken along the line VIIId-VIIId of FIG. 7.
Figure 12B:
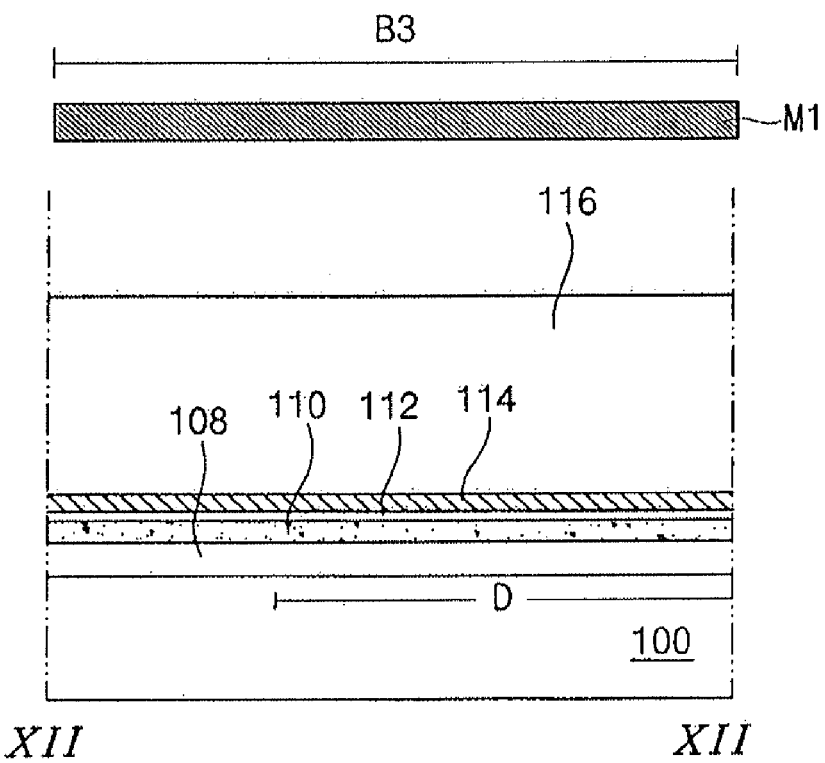
Figure 12C:
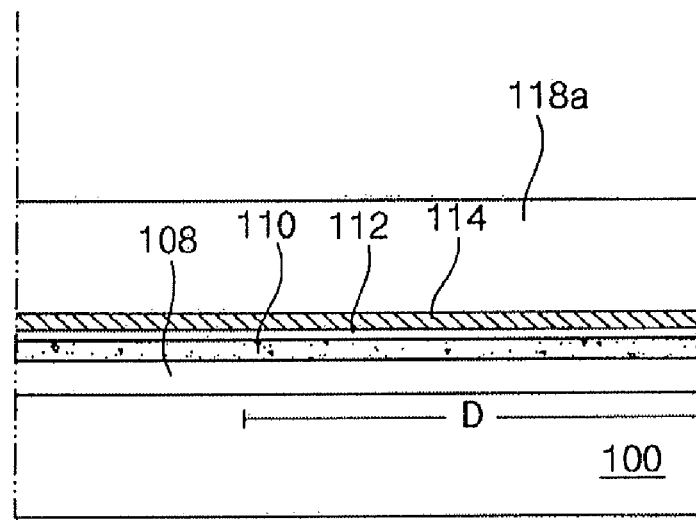
Figure 12D:
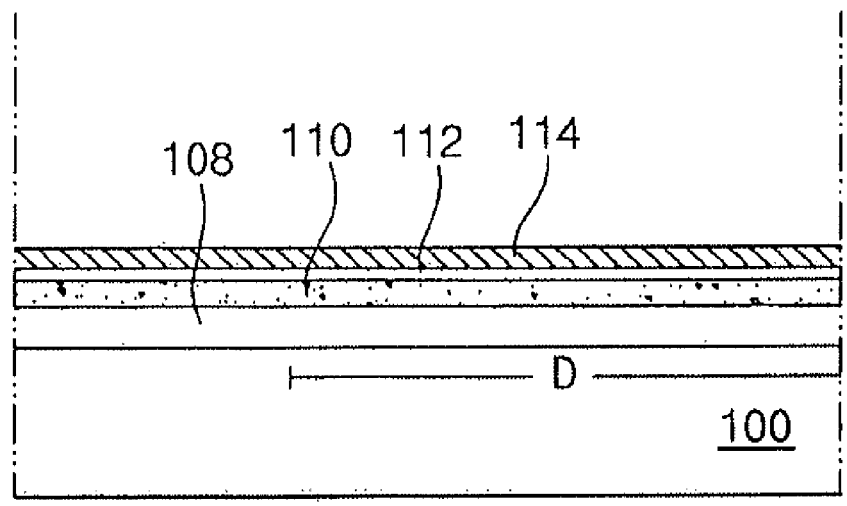
Figure 12E:
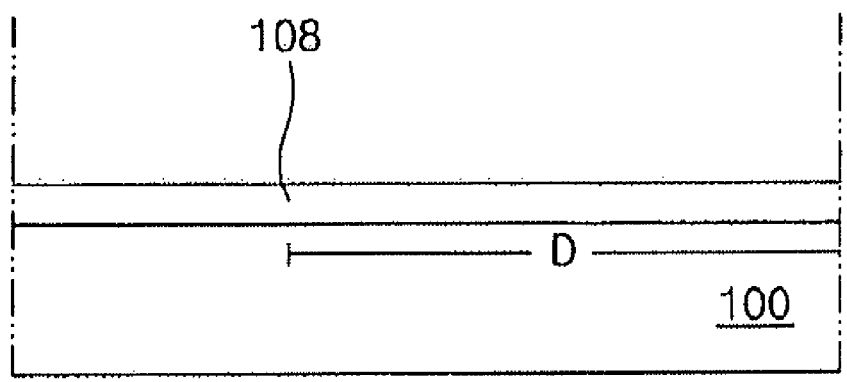
Figure 12F:
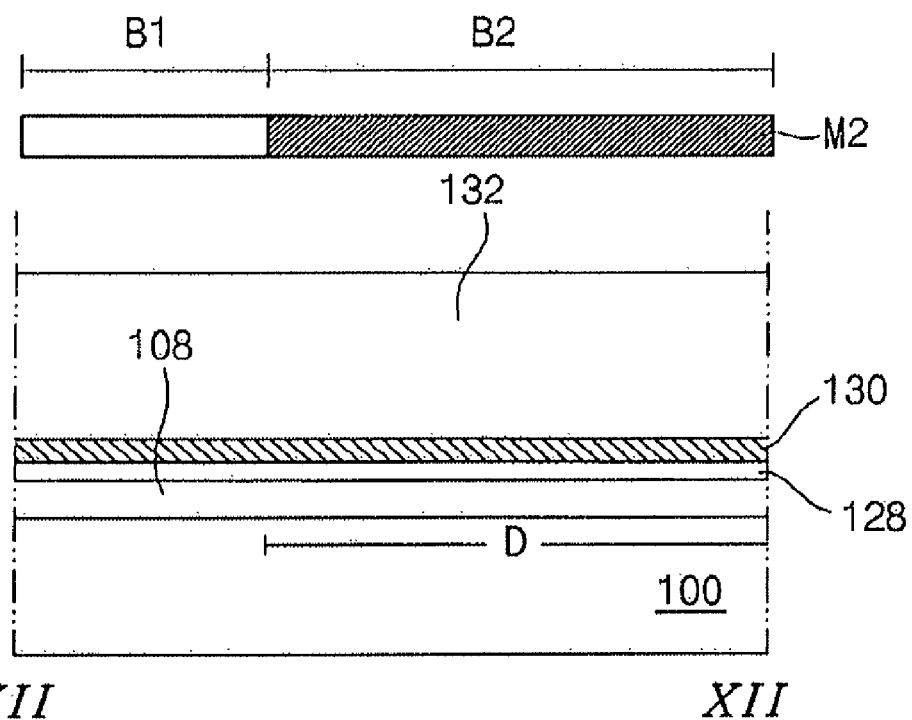
Figure 12G:
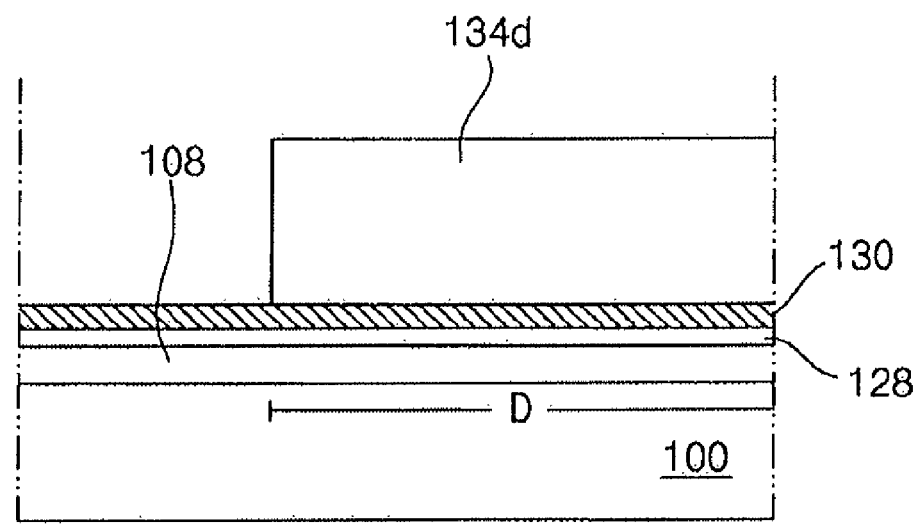
Figure 12H:
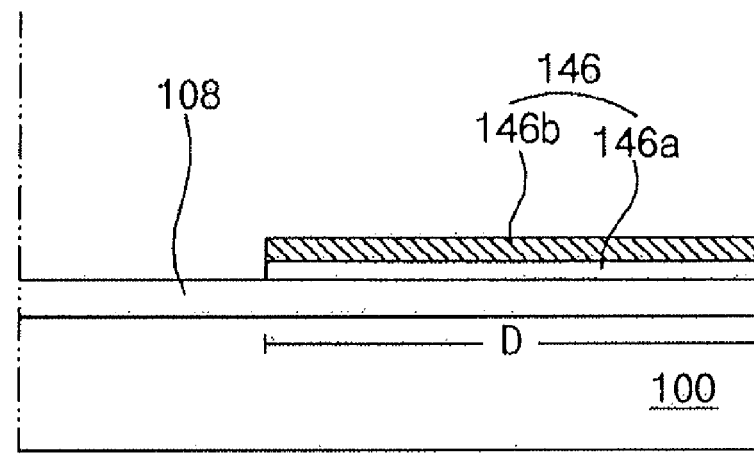
Figure 12I:
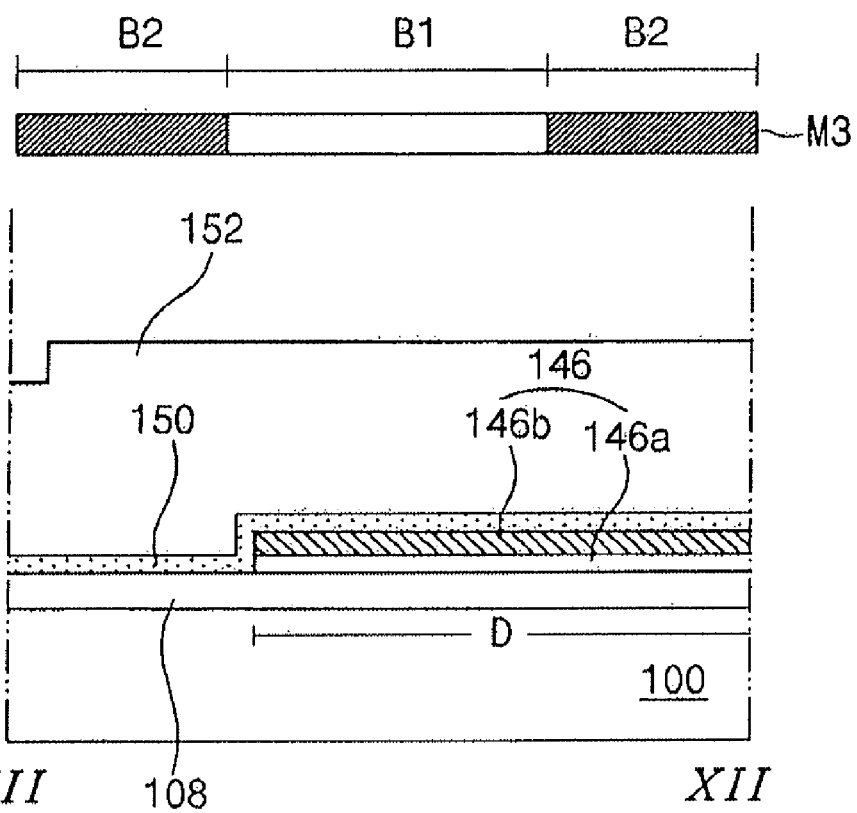
Figure 12J:
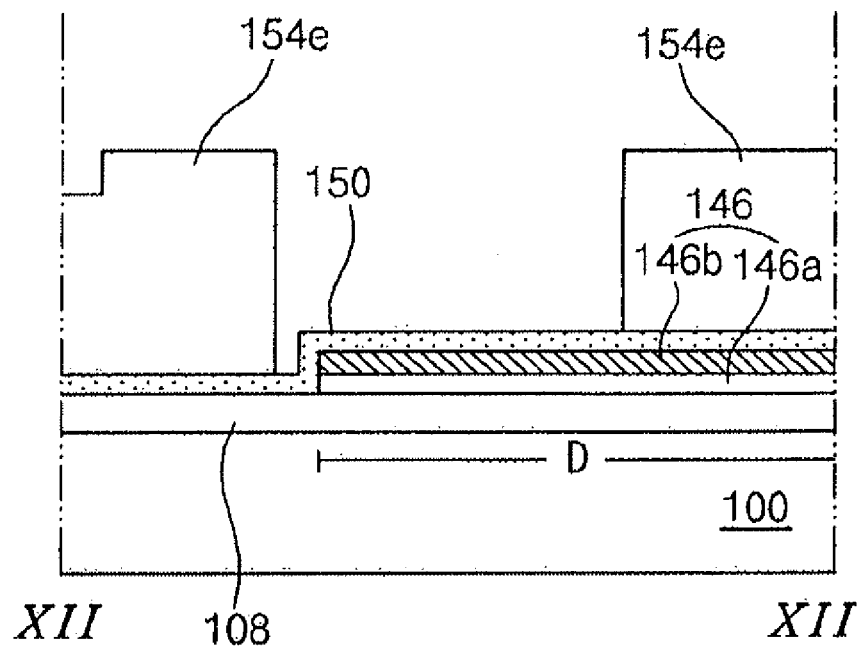
Figure 12K:
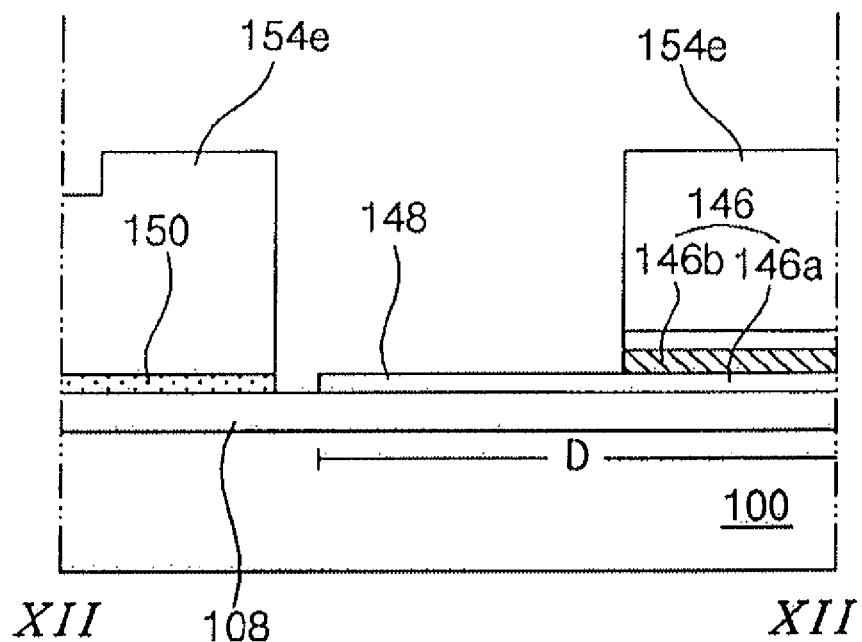
Figure 12L:
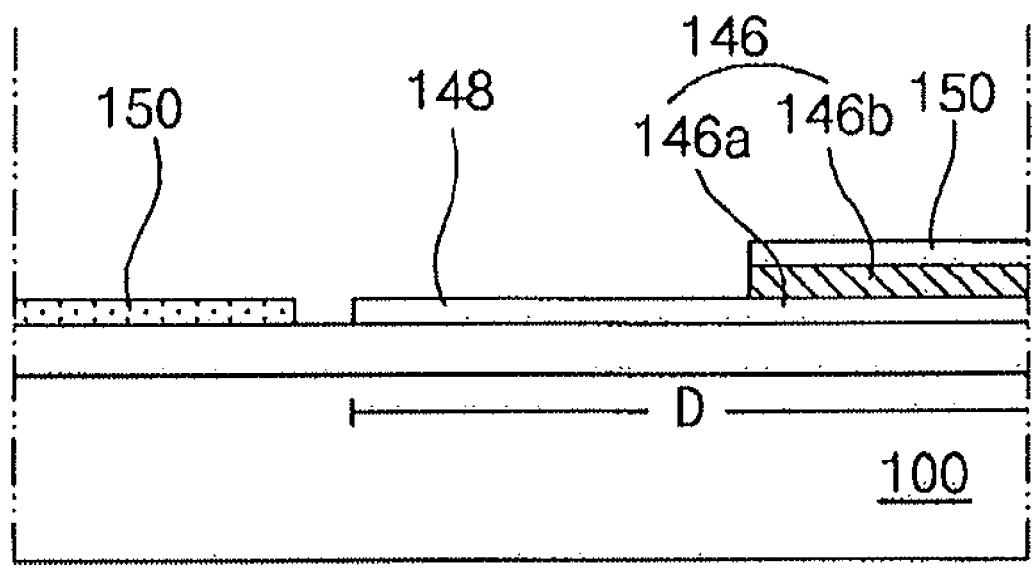

FIGS. 8A to 8D are cross-sectional views taken along the lines VIIIa-VIIIa, VIIIb-VIIIb, VIIIc-VIIIc and VIIId-VIIId of FIG. 7, respectively. FIG. 8A shows a switching region, a pixel region and a storage region, FIG. 8B shows a pixel region, FIG. 8C shows a gate region, and FIG. 8D shows a data region.

As shown in FIGS. 8A to 8D, the substrate 100 includes a pixel region P, a switching region S, a storage region C, a gate region G and a data region D. A portion of a gate region GL, where the gate line and the gate pad are formed, is defined as a storage region C where the storage capacitor is formed. Each pixel region P includes a switching region S. The data line and the data pad are formed in the data region D, and the TFT T is formed in the switching region S.

The TFT T includes the gate electrode 102, a first insulating layer 108, the active layer 122, the ohmic contact layer 124, the buffer metal layer 126, the source electrode 136 and the drain electrode 138. A second insulating layer 150 is formed on the TFT T. The gate electrode 102 is formed on the substrate 100, and the first gate insulating layer 108 is formed on the gate electrode 102. The active layer 122 is formed on the gate insulating layer 108 and corresponds to the gate electrode 102. The ohmic contact layer 124 is formed on the active layer 122 and the active layer 122 is exposed through the ohmic contact layer 124. The buffer metal layer 126 is formed between the ohmic contact layer 124 and the source electrode 136 and between the ohmic contact layer 124 and the drain electrode 138. Accordingly, the source electrode 136 and the drain electrode 138 are connected to the ohmic contact layer 124 through the buffer metal layer 126.

The source electrode 136 includes first and second source metal layers 136a and 136b, and the drain electrode 138 includes first and second drain metal layers 138a and 138b. The first source metal layer 136a is formed of the same material and the same layer as the first drain metal layer 138a. For example, the first source metal layer 136a and the first drain metal layer 138a may include a transparent conductive material. In addition, the second source metal layer 136b is formed of the same material and the same layer as the second drain metal layer 138b. For example, the second source metal layer 136b and the second drain metal layer 138b may include an opaque metallic material.

When the first source metal layer 136a and the first drain metal layer 138a directly contact the ohmic contact layer 124, the TFT T may have a relatively high contact resistance of the source and drain electrodes 136 and 138. The buffer metal layer 126 may be formed between the first source and first drain metal layers 136a and 138a and the ohmic contact layer 124 to reduce the contact resistance.

Moreover, the data line 146, which extends from the source electrode 138 and is disposed in the data region D, has the same structure as the source electrode 138. Namely, the data line 146 has a first data metal layer 146a and a second data metal layer 146b. The first and second data metal layers 146a and 146b are formed of the same material and in the same layer as the first and second source metal layers 136a and 136b, respectively. The data pad 148, however, is disposed at one end of the data line 146 and is a single layer. The single layer of the data pad 148 is formed of the same material and the same layer as the first data metal layer 146a. Namely, the data pad 148 is formed of a transparent conductive material. The second insulating layer 150 covers the data line 146 and the data pad 148 is exposed through the second insulating layer 150.

The gate line 104 extends from the gate electrode 102 and is disposed in the gate region G. The gate pad 106 is disposed at one end of the gate line 104. The first insulating layer 108 covers the gate line 104, while the gate pad 106 is exposed through the first insulating layer 108. The transparent gate pad terminal 142 is formed on the gate pad 106 and contacts the gate pad 106.

The gate line 104 and the pixel electrode 140 overlap each other to constitute the storage capacitor Cst such that an overlapped portion of the gate line 104 and an overlapped portion of the pixel electrode 140 function as a first storage electrode and a second storage electrode, respectively.

The opaque metal pattern MP is formed in edge portions of the pixel electrode 140. The opaque metal pattern MP has a desired width considering an alignment error. Aperture ratio is not reduced because of the opaque metal pattern MP. When a black matrix (not shown) to shield the data line 146 is formed on a counter substrate (not shown), the black matrix can be formed to have a relatively small width due to the opaque metal pattern MP. Moreover, since the opaque metal pattern MP is disposed in a boundary portion between the pixel electrode 140 and the black matrix (not shown), there is no light leakage between the pixel electrode 140 and the black matrix due to the opaque metal pattern MP.

In the array substrate for an LCD device, the active layer 122 of amorphous silicon and the ohmic contact layer 124 of impurity-doped amorphous silicon have an island shape formed within the gate electrode 102 and an amorphous silicon layer is not formed under the data line 146. Because the gate electrode 102 shields light from a backlight unit (not shown) under the array substrate, the active layer 122 is not exposed to the light and a light leakage current is not generated in the TFT T. Further, since the amorphous silicon layer is not formed under the data line 146 and does not protrude beyond the data line 146, a wavy noise does not occur in the LCD device and the black matrix covering the protruding portion is not necessary. As a result, an aperture ratio of the LCD device is improved. Moreover, as mentioned above, because the pixel electrode 140 has a relatively small resistance due to the opaque metal pattern MP, the pixel electrode is formed to have a relatively thin thickness such that transmittance and brightness are improved.

A four mask process for fabricating an array substrate for an LCD device is explained with reference to FIGS. 9A to 9L, FIGS. 10A to 10L, FIGS. 11A to 11L and FIGS. 12A to 12L.

FIGS. 9A to 9L are cross-sectional views showing a fabrication process of a portion taken along the line VIIIa-VIIIa of FIG. 7. FIGS. 10A to 10L are cross-sectional views showing a fabrication process of a portion taken along the line VIIIb-VIIIb of FIG. 7. FIGS. 11A to 11L are cross-sectional views showing a fabrication process of a portion taken along the line VIIIc-VIIIc of FIG. 7. FIGS. 12A to 12L are cross-sectional views showing a fabrication process of a portion taken along the line VIIId-VIIId of FIG. 7. FIGS. 9A to 9L show the switching region and the storage region, FIGS. 10A to 10L show the pixel region, FIGS. 11A to 11L show the gate region, and FIGS. 12A to 12L show the data region.

FIGS. 9A, 10A, 11A and 12A show a first mask process. As shown in FIGS. 9A, 10A, 11A and 12A, a first metal layer (not shown) is formed on a substrate 100 by depositing one or more selected from a conductive metallic material group including aluminum (Al), aluminum alloy (AlNd), chromium (Cr), molybdenum (Mo), tungsten (W), titanium (Ti), copper (Cu) and tantalum (Ta). The first metal layer is patterned through a first mask process using a first mask (not shown) to form a gate electrode 102 in the switching region S, a gate line 104 and a gate pad 106 in the gate region G. The gate electrode 102 is connected to the gate line 104 and the gate pad 106 is formed at one end of the gate line 104. The gate line 104 is also formed in the storage region C which functions as a first electrode of a storage capacitor.

FIGS. 9B to 9E, 10B to 10E, 11B to 11E and 12B to 12E show a second mask process. As shown in FIGS. 9B, 10B, 11B and 12B, a first insulating layer 108, an intrinsic amorphous silicon layer 110, an impurity-doped amorphous silicon layer 112 and a second metal layer 114 are sequentially formed on the gate electrode 102, the gate line 104 and the gate pad 106. A first PR layer 116 is formed on the second metal layer 114.

The first insulating layer 108 may include at least one of an inorganic insulating material such as silicon nitride and silicon oxide, and the second metal layer 114 may include one or more selected from a conductive metallic material group including aluminum (Al), aluminum alloy (AlNd), chromium (Cr), molybdenum (Mo), tungsten (W), titanium (Ti), copper (Cu), copper (Cu) alloy and tantalum (Ta). The second metal layer 114 may include a material, e.g., molybdenum (Mo), which constitutes an ohmic contact with impurity-doped amorphous silicon and is available in a dry etching method.

A second mask M1 having a transmitting portion B1, a blocking portion B2 and a half-transmitting portion B3 is disposed over the first PR layer 116. The blocking portion B2 corresponds to the switching region S, the transmitting portion B1 corresponds to the gate pad 106 and the half-transmitting portion B3 corresponds to the data region D and the pixel region P. Note that an area of the blocking portion B2 corresponding to the switching region S is smaller than an area of the gate electrode 102. The first PR layer 116 is exposed to light through the second mask M1 and then the exposed first PR layer 116 is developed.

Next, as shown in FIGS. 9C, 10C, 11C and 12C, first and second PR patterns 118a and 118b are formed on the second metal layer 114. The first PR pattern 118a corresponds to the half-transmitting portion B3 of the second mask M1 and has a first thickness t1. The second PR pattern 118b corresponds to the blocking portion B2 of the second mask M1 and has a second thickness t2 greater than the first thickness t1. The gate pad 106 is exposed through the first PR pattern 118a. In other words, the first PR layer 116 is partially removed to form the first PR pattern 118a and is not removed to form the second PR pattern 118b. And the first PR layer 116 is completely removed to expose the gate pad 106. The second PR pattern 118b corresponds to the gate electrode 102.

Next, as shown in FIGS. 9D, 10D, 11D and 12D, the second metal layer 114, the impurity-doped amorphous silicon layer 112, the intrinsic amorphous silicon layer 110 and the first insulating layer 108 are removed using the first and second PR patterns 118a and 118b (of FIGS. 9C, 10C, 11C and 12C) as a mask to form a gate pad contact hole CH1 in the gate region G. The gate pad contact hole CH1 exposes the gate pad 106.

And then, the first PR pattern 118a is removed to form a third PR pattern 120 in the switching region S. The second PR pattern 118b (of FIG. 9C) having the second thickness t2 is partially removed to form the third PR pattern 120 having a third thickness t3 corresponding to the difference of the first and second thicknesses t1 and t2. The first PR pattern 118a having the first thickness t1 is completely removed to expose the second metal layer 114.

Next, as shown in FIGS. 9E, 10E, 11E and 12E, the second metal layer 114, the impurity-doped amorphous silicon layer 112 and the intrinsic amorphous silicon layer 110 are patterned using the third PR pattern 120 as a mask to form an active layer 122, an ohmic contact layer 124 and a buffer metal layer 126 on the first gate insulating layer 108 in the switching region S. Then, the third PR pattern 120 is removed.

Because the active layer 122 has an island shape and is disposed within the gate electrode 102, the active layer is not exposed by light emitted from a backlight unit (not shown) under the array substrate and there is no current leakage.

FIGS. 9F to 9H, 10F to 10H, 11F to 11H and 12F to 12H show a third mask process. As shown in FIGS. 9F, 10F, 11F and 12F, a transparent metal layer 128 and an opaque metal layer 130 are sequentially formed on the substrate 100 having the active layer 122, the ohmic contact layer 124 and the buffer metal layer 126. The transparent metal layer 128 includes a transparent conductive material such as indium-tin-oxide (ITO) and indium-zinc-oxide (IZO), and the opaque metal layer 130 includes one or more selected from metallic a conductive material group including aluminum (Al), aluminum alloy (AlNd), chromium (Cr), molybdenum (Mo), tungsten (W), titanium (Ti), copper (Cu), copper (Cu) alloy and tantalum (Ta). Next, a second PR layer 132 is formed on the opaque metal layer 130.

A third mask M2 having a transmitting portion B1 and a blocking portion B2 is disposed over the second PR layer 132. The transmitting portion B1 and the blocking portion B2 at both sides of the transmitting portion B1 respectively correspond to the switching region S and the storage region C, and the blocking portion B2 corresponds to the gate pad 106, the data region D and the pixel region P. The transmitting portion B1 also corresponds to boundary portions between the pixel region P and the data region D. The second PR layer 132 is exposed to light through the third mask M3 and then the exposed second PR layer 132 is developed.

As shown in FIGS. 9G, 10G, 11G and 12G, fourth, fifth, sixth and seventh PR patterns 134a, 134b, 134c and 134d are formed on the opaque metal layer 130 such that the opaque metal layer 130 is partially exposed by the fourth, fifth, sixth and seventh PR patterns 134a, 134b, 134c and 134d. The fourth, fifth, sixth and seventh PR patterns 134a, 134b, 134c and 134d correspond to the switching region S, the pixel region P and the storage region C, the gate pad 106 and the data region D, respectively. A center portion of the switching region S is exposed by the fourth PR pattern 134a.

Next, as shown in FIGS. 9H, 10H, 11H and 12H, the opaque metal layer 130 and the transparent metal layer 128 are sequentially patterned using the fourth, fifth, sixth and seventh PR patterns 134a, 134b, 134c and 134d as a mask. As a result, the source electrode 136 and the drain electrode 138 are formed in the switching region S, and first and second pixel patterns 129 and 131 are formed in the pixel region P and the storage region C. Moreover, first and second gate pad terminal patterns 143 and 144 are formed on the gate pad 106, and the data line 146 formed in the data region D. The source electrode 136, the drain electrode 138 and the data line 146 have a double-layered structure formed from the transparent metal layer 128 and the opaque metal layer 130. Namely, the source electrode 136 includes the first and second source metal layers 136a and 136b, the drain electrode 138 includes the first and second drain metal layers 138a and 138b, and the data line 146 includes the first and second data metal layers 146a and 146b. The first source metal layer 136a, the first drain metal layer 138a and the first data metal layer 146a are formed of a transparent metallic material. The second source metal layer 136b, the second drain metal layer 138b and the second data metal layer 146b are formed of an opaque metallic material. Moreover, the transparent metal layer 128 and the opaque metal layer 130 in the center portion of the switching region S are removed to partially expose the buffer metal layer 126. Namely, the buffer metal pattern 126 is exposed between the source and drain electrodes 136 and 138. Next, the fourth, fifth, sixth and seventh PR patterns 134a, 134b, 134c and 134d are removed. And then, the buffer metal layer 126 exposed between the source and drain electrodes 136 and 138 and the ohmic contact layer 124 under the exposed the buffer layer 126 are removed such that the active layer 122 is exposed. A contact resistance between each of the first source metal layer 136a and the first drain metal layer 138a and the ohmic contact layer 124 is reduced due to the buffer metal layer 126. When the buffer layer 126 and the ohmic contact layer 124 are removed with a removing condition, the source electrode 136, the drain electrode 138, the pixel patterns 129 and 131, the gate pad terminal pattern 141, the data line 146 and the data pad pattern 147 are not etched.

FIGS. 9I to 9L, 10I to 10L, 11I to 11L and 12I to 12L show a fourth mask process.

As shown in FIGS. 9I, 10I, 11I and 12I, a second insulating layer 150 is formed on the substrate 100. The second insulating layer 150 includes an inorganic insulating material such as silicon nitride and silicon oxide. A third PR layer 152 is formed on the second insulating layer 150, and a fourth mask M3 having a transmitting portion B1 and a blocking portion B2 is disposed over the third PR layer 152. The blocking portions B2 correspond to at least the switching region S, and the transmitting portion B1 corresponds to at least the pixel region P and the gate pad 106. Moreover, the blocking portion B2 corresponds to the data region D except for an end portion of the data region D. The transmitting portion B1 corresponds to the end portion of the data region D. The blocking portion B2 corresponding to the data region D has a width greater than the data line 146. A width of the blocking portion B2 corresponding to the data region D depends on the alignment error. And the data pad is to be formed in the end portion of the data region D. The third PR layer 152 is exposed to light through the fourth mask M3 and then the exposed third PR layer 152 is developed.

As shown in FIGS. 9J, 10J, 11J and 12J, eighth, ninth, tenth, eleventh and twelfth PR patterns 154a, 154b, 154c, 154d and 154e respectively corresponding to the blocking portion B2 of the fourth mask M3 are formed on the second insulting layer 150. The eighth PR pattern 154a is disposed in the switching region S, the ninth PR pattern 154b is disposed adjacent to the storage region C, the tenth PR pattern 154c is disposed in the data region D, the eleventh PR pattern 154d is disposed at both sides of the gate pad 106, and the twelfth PR pattern 154e is disposed at both sides of the end portion of the data region D. Because the blocking portion B2 corresponding to the data region D has a width greater than that of the data line 146, the tenth PR pattern 154c covers boundary portions of the pixel region P. The second insulating layer 150 corresponding to the pixel region P, the gate pad 106 and the end portion of the data region D is exposed through the eighth, ninth, tenth, eleventh and twelfth PR patterns 154a, 154b, 154c, 154d and 154e.

Next, as shown in FIGS. 9K, 10K, 11K and 12K, the second insulating layer 150, the second pixel pattern 131, the second gate pad terminal pattern 141 and the second data metal layer 146b in the end portion of the data region D are patterned using the eighth, ninth, tenth, eleventh and twelfth PR patterns 154a, 154b, 154c, 154d and 154e as a mask. As a result, a pixel electrode 140 of a transparent metal is formed in the pixel region P, the gate pad terminal 142 is formed on the gate pad 106, and the data pad 148 is formed in the end portion of the data region D. The pixel electrode 140, the gate pad terminal 142 and the data pad 148 are formed from the transparent metal layer 128. Since the tenth PR pattern 154c cover the boundary portions of the pixel region P, the opaque metal layer 130 in the boundary portion of the pixel region P is not removed to form an opaque metal pattern MP on the pixel electrode 140 in the boundary portion of the pixel region P. Moreover, the pixel electrode 140 overlaps the gate line 104 in the storage region C.

Next, as shown in FIGS. 9L, 10L, 11L and 12L, the eighth, ninth, tenth, eleventh and twelfth PR patterns 154a, 154b, 154c, 154d and 154e are removed. As a result, a TFT T including the gate electrode 102, the first insulating layer 120, the active layer 122, the ohmic contact layer 124, the buffer metal layer 126, the source electrode 136 and the drain electrode 138 is formed in the switching region S. Each of the source and drain electrodes 136 and 138 includes a double-layered structure of a first layer of a transparent metal material and a second layer of an opaque metal material. The pixel electrode 140 in the pixel region P includes a single layer of the transparent metal material and extends from the first drain metal layer 138a of the drain electrode 138. The gate pad terminal 142 in the end portion of the gate region G includes a single layer of the transparent metal material and contacts the gate pad 106. The data pad 148 in the end portion of the data region D includes a single layer of the transparent metal material and extends from the first data metal layer 146a of the data line 146. In addition, the pixel electrode 140 overlaps the gate line 104 in the storage region C to constitute a storage capacitor Cst having the overlapped portion of the gate line 104 as a first storage electrode, the overlapped portion of the pixel electrode 140 as a second storage electrode and the first insulating layer 120 between the first and second storage electrodes as a dielectric material.

An array substrate for an LCD device according to the present disclosure, where a semiconductor layer is not formed under a data line, is fabricated through the above four mask process. The four mask process of fabricating an array substrate for an LCD device according to the present disclosure may include: a first mask process of forming a gate electrode on a substrate, a gate line connected to the gate electrode and a gate pad at one end of the gate line; a second mask process of forming a first insulating layer exposing the gate pad, an active layer on the first insulating layer, an ohmic contact pattern on the active layer and a buffer metal pattern on the ohmic contact pattern; a third mask process of forming source and drain electrodes on the buffer metal pattern, a pixel pattern extending from the drain electrode, a gate pad terminal pattern contacting the gate pad, a data line extending from the source electrode and a data pad pattern at one end of the data line with a transparent metal layer and an opaque metal layer, and patterning the buffer metal pattern and the ohmic contact pattern to form a buffer metal layer and an ohmic contact layer; a fourth mask process of forming a second insulating layer on an entire surface of the substrate and patterning the pixel pattern, the gate pad terminal pattern and the data metal layer to form a pixel electrode, an opaque metal pattern on boundary portion of the pixel electrode, a gate pad terminal and a data pad of the transparent metal layer.

As a result, in an array substrate for an LCD device according to the present disclosure, since a semiconductor layer is not formed under a data line, a wavy noise is prevented and aperture ratio is improved. In addition, because an active layer having an island shape is formed within a gate electrode, a light leakage current is prevented and properties of a thin film transistor (TFT) is improved. Further, because an opaque metal pattern is formed on a boundary portion of a pixel electrode, aperture ratio is improved. Moreover, because resistance of a pixel electrode is reduced due to an opaque metal pattern on a boundary portion of the pixel electrode, the pixel electrode can be formed to have a relative low thickness such that transmittance of the LCD device is improved.

It will be apparent to those skilled in the art that various modifications and variations can be made in the organic electroluminescent device and fabricating method thereof of the present disclosure without departing from the spirit or scope of the disclosure. Thus, it is intended that the present disclosure cover the modifications and variations of this disclosure provided they come within the scope of the appended claims and their equivalents.

The invention claimed is:

1. A method of fabricating an array substrate for a liquid crystal display device, comprising:
  forming a gate electrode on a substrate having a pixel region and a gate line connected to the gate electrode;
  forming an insulating layer on the gate electrode and the gate line, an active layer and an ohmic contact pattern on the insulating layer and corresponding to the gate electrode;
  forming source and drain electrodes on the ohmic contact pattern, the source electrode comprising a first source layer of a transparent conductive metallic material and a second source layer of an opaque conductive metallic material, the drain electrode comprising a first drain layer of the transparent conductive metallic material and a second drain layer of the opaque conductive metallic material;

forming a pixel region from a data line connected to the source electrode and that crosses the gate line, wherein the pixel region is connected to the drain electrode and comprises a first pixel layer of the transparent conductive metallic material and a second pixel layer of the opaque conductive metallic material; and partially removing the second pixel layer to form a pixel electrode of the first pixel layer and an opaque metal pattern of the second pixel layer on end portions of the pixel electrode.

2. The method according to claim 1, wherein the end portions are adjacent to the data line.

3. The method according to claim 1, wherein forming an ohmic contact pattern on the first insulating layer comprises forming a buffer metal pattern on the ohmic contact pattern.

4. The method according to claim 1, wherein forming a gate electrode comprises forming a gate pad at one end of the gate line, forming an insulating layer comprises patterning the insulating layer to expose the gate pad, the method further comprising:

forming a gate pad terminal pattern including a first gate pad terminal layer of the transparent conductive metallic material and a second gate pad terminal layer of the opaque conductive metallic material; and removing the second gate pad terminal layer to form a gate pad terminal of the first gate pad terminal layer.

5. The method according to claim 4, wherein forming an insulating layer comprises:

sequentially forming the insulating layer, an intrinsic amorphous silicon layer, an impurity-doped amorphous silicon layer and a photoresist layer on the gate electrode, the gate line and the gate pad;

exposing the photoresist layer through a mask having a transmitting portion, a blocking portion and a half-transmitting portion;

developing the photoresist layer to form a first photoresist pattern exposing the impurity-doped amorphous silicon layer corresponding to the gate pad, a portion of the first photoresist pattern corresponding to the active layer having a first thickness and the other portion of the photoresist layer having a second thickness thinner than the first thickness;

etching the impurity-doped amorphous silicon layer, the intrinsic amorphous silicon layer and the first insulating layer using the first photoresist pattern as an etching mask to expose the gate pad;

removing the other portion of the first photoresist layer having the second thickness to form a second photoresist pattern corresponding to the active layer; and etching the impurity-doped amorphous silicon layer and the intrinsic amorphous silicon layer using the second photoresist pattern as an etching mask.

6. The method according to claim 5, wherein the transmitting portion and the blocking portion of the mask correspond to the gate pad and the active layer, respectively.

7. The method according to claim 5, wherein the second photoresist pattern comprises a width that is less than a width of the gate electrode.

8. The method according to claim 1, wherein forming the pixel region comprises forming a data pad pattern at one end of the data line, the data pad pattern including a first data pad layer of the transparent conductive metallic material and a second data pad layer of the opaque conductive metallic material, and partially removing the second pixel layer comprises removing the second data pad layer to form a data pad of the first data pad layer.

9. The method according to claim 1, wherein forming the source and drain electrodes and the pixel region comprises:

sequentially forming a transparent conductive layer, an opaque conductive layer and a photoresist layer on the ohmic contact pattern;

exposing the photoresist layer through a second mask having a transmitting portion and a blocking portion;

developing the photoresist layer to form a first photoresist pattern corresponding to the source and drain electrodes, a second photoresist pattern corresponding to the pixel pattern, a third photoresist pattern corresponding to the data line;

etching the opaque conductive layer and the transparent conductive layer using the first, second and third photoresist patterns as an etching mask; and etching the ohmic contact pattern using the source and drain electrodes as an etching mask to expose the active layer.

10. The method according to claim 1, wherein the insulating layer comprises a first insulating layer, and wherein forming the pixel pattern comprises:

sequentially forming a second insulating layer and a photoresist layer on the source and drain electrodes and on the pixel region;

exposing the photoresist layer through a mask having a transmitting portion and a blocking portion;

developing the photoresist layer to form a photoresist pattern exposing the second insulating layer corresponding to the pixel region, wherein the photoresist pattern has a width greater than a width of the data line to cover the end portions of the pixel electrode; and etching the second insulating layer and the second pixel layer using the photoresist pattern as an etching mask to form the pixel electrode and the opaque metal pattern on the end portions of the pixel electrode.

11. A method of fabricating an array substrate for a liquid crystal display device, comprising:

forming a gate electrode on a substrate having a pixel region and a gate line connected to the gate electrode;

forming an insulating layer on the gate electrode and the gate line;

forming an active layer and an ohmic contact pattern on the insulating layer and corresponding to the gate electrode;

forming source and drain electrodes on the ohmic contact pattern, the source electrode comprising a first source layer of a transparent conductive metallic material and a second source layer of an opaque conductive metallic material, the drain electrode comprising a first drain layer of the transparent conductive metallic material and a second drain layer of the opaque conductive metallic material;

forming a pixel region from a data line connected to the source electrode and that crosses the gate line, wherein the pixel region is connected to the drain electrode and comprises a first pixel layer of the transparent conductive metallic material and a second pixel layer of the opaque conductive metallic material;

forming a pixel electrode of the first pixel layer; and forming an opaque metal pattern of the second pixel layer on end portions of the pixel electrode.

* * * * *